US008035236B2

(12) United States Patent
Hawker et al.

(10) Patent No.: US 8,035,236 B2
(45) Date of Patent: Oct. 11, 2011

(54) SEMICONDUCTOR DEVICE COMPRISING HIGH PERFORMANCE ENCAPSULATION RESINS

(75) Inventors: Craig J. Hawker, Santa Barbara, CA (US); Hunaid Nulwala, Goleta, CA (US); Anika A. Odukale, Lompoc, CA (US); Jeffrey A. Gerbec, Goleta, CA (US); Kenichi Takizawa, Kitakyushu (JP)

(73) Assignees: The Regents of the University of California, Oakland, CA (US); Mitsubishi Chemical Corporation, Tokyo (JP)

( * ) Notice: Subject to any disclaimer, the term of this patent is extended or adjusted under 35 U.S.C. 154(b) by 174 days.

(21) Appl. No.: 12/580,555

(22) Filed: Oct. 16, 2009

(65) Prior Publication Data

US 2011/0089580 A1 Apr. 21, 2011

(51) Int. Cl.
*H01L 23/29* (2006.01)
*H01L 21/31* (2006.01)

(52) U.S. Cl. ............... 257/788; 257/791; 257/E21.261; 257/E23.12; 438/778; 438/780

(58) Field of Classification Search .................. 257/100, 257/632, 642, 787, 788, 791, E23.119, E23.12, 257/E21.26, E21.261; 438/778, 780
See application file for complete search history.

(56) References Cited

U.S. PATENT DOCUMENTS

| | | | |
|---|---|---|---|
| 5,648,687 A | 7/1997 | Matsuo et al. | |
| 6,204,523 B1 | 3/2001 | Carey et al. | |
| 6,590,235 B2 | 7/2003 | Carey et al. | |
| 7,095,125 B2 * | 8/2006 | Osada et al. | 257/793 |
| 7,125,917 B2 | 10/2006 | Starkey | |
| 7,160,972 B2 | 1/2007 | Young et al. | |
| 7,449,535 B2 * | 11/2008 | Keller et al. | 528/5 |
| 7,521,813 B2 * | 4/2009 | Kashiwagi et al. | 257/791 |
| 7,732,553 B2 | 6/2010 | Hawker et al. | |
| 2009/0221783 A1 | 9/2009 | Hawker et al. | |
| 2010/0225010 A1 * | 9/2010 | Katayama | 257/791 |
| 2010/0276721 A1 * | 11/2010 | Yoshitake et al. | 257/99 |

FOREIGN PATENT DOCUMENTS

| | | |
|---|---|---|
| JP | 5-25300 | 2/1993 |
| JP | 2002-203989 | 7/2002 |
| JP | 2004-356506 | 12/2004 |
| WO | WO2005/085303 A1 | 9/2005 |

(Continued)

OTHER PUBLICATIONS

Journal of Polymer Science; Part A: Polymer Chemistry 2006, 44, Manoj K. Kolel-Veetil, et al., "Formation of Elastomeric Network Polymers from Ambient Heterogeneous Hydrosilations of Carboranylenesiloxane and Branched Siloxane Monomers" pp. 147-155.

(Continued)

*Primary Examiner* — Tuan N. Quach
(74) *Attorney, Agent, or Firm* — Berliner & Associates

(57) ABSTRACT

A semiconductor device comprising curable polyorganosiloxane composites is provided where the composites contain at least 0.1 wt % of the 4$^{th}$ and/or 13$^{th}$ group elements of the periodic table. The cured polyorganosiloxane composites may be catalyst-free, have increased stability, and can be used as encapsulation resin at a temperature far lower than 300° C., have excellent light transmission properties (colorless transparency) in a wavelength region of from ultraviolet light to visible light, light resistance, heat resistance, resistance to moist heat and UV resistance, and has excellent adhesiveness toward metal, ceramics, and plastic surfaces over a long period of time.

21 Claims, 15 Drawing Sheets

FOREIGN PATENT DOCUMENTS

WO WO2006/055456 A1 5/2006
WO WO2008/018981 A2 2/2008

OTHER PUBLICATIONS

Journal of Polymer Science; Part A: Polymer Chemistry 1998, 36, Eric J. Houser, et al. Hydrosilation Routes to Materials with HighThermal and Oxidative Stabilities, pp. 1969-1972.

Hyomen Kagaku, vol. 18, No. 9, Norihiro Inagaki, "Surface Modification of Polymers by Plasma and Excimer Lasers", pp. 543-548, 1997.

Hyomen Kagaku, vol. 19, No. 2, Kazuo Kurosaki, "Evolution of Surface Analysis for Functional Polymers 2. Estimation of Modified Polymer Surface", pp. 106-113, 1998.

* cited by examiner

SEMICONDUCTOR DEVICE COMPRISING HIGH PERFORMANCE ENCAPSULATION RESINS

FIELD OF THE INVENTION

The invention relates to the preparation of a semiconductor device using hybrid metal oxide polyorganosiloxane based elastomers with high transparency, high heat stability, high UV flux stability, mechanically tunable properties, suitable adhesiveness, and chemically inertness.

BACKGROUND OF THE INVENTION

High brightness light emitting diodes (HBLEDs) offer enhanced energy efficiency thus making them suitable for specialty lighting applications. An LED device is usually composed of the LED chip fabricated onto a substrate and then encapsulated by a material acting as a lens and a luminescence conversion member. The following are the operational requirements of a material to be utilized as an encapsulant of LEDs: optical clarity, high temperature resistant, UV resistant, high refractive index and good adhesiveness toward LED packaging materials.

Encapsulant materials must be optically transparent (greater than 90% transmittance) and should be able to withstand high temperatures, for extended periods of time, without degradation in mechanical and optical performance. The LED device encounters high temperature conditions during the device fabrication (soldering up to 260° C.) and during the actual device operation (around 150° C. for thousands of hours).

Epoxy resins have conventionally been used as a transparent resin for the encapsulation (1, 2). Also, PMMA (polymethylmethacrylate-PMMA), polycarbonate, and optical nylon have been used. However, optical properties of such conventional resins degrade over time. Coloration, or "yellowing", occurs either by heat induced degradation (heat resistance) or via prolonged irradiation with short wavelength light (ultraviolet-resistance). The degradation results loss of mechanical and chemical properties. Due to the loss of physical properties water enters from the encapsulated portion to negatively effect the performance of the LED, and the resin discolors by ultraviolet light emitted from LED to decrease light transmittance of the encapsulated portion. Mechanical degradation of the encapsulant also results in cracking, shrinking and/or delamination from the substrate. Thus, it is desirable to have an encapsulant system that is tough and flexible enough to serve as a mechanical support for the LED component, and relieve internal stress during the device fabrication (prevent damage to LED chip or wires), and during temperature cycling (expansion and contraction of materials with different thermal expansion coefficients).

To overcome the above problems, a fluorine-containing cured product in transparent encapsulation of an emission element has been proposed (3). Although this fluorine-containing cured product has excellent colorless transparency, light resistance and heat resistance as compared with the epoxy resin, it has poor adhesion to LED's and it is liable to peel from the material to be encapsulated. The LED is generally made of the following materials (GaN chip, phosphors) and has higher refractive index in the visible light region from 2.5 to 3.0. The fluorine-containing cured encapsulant has low refractive index of light when compared to GaN, phosphor components in the same optical wavelength. Therefore, the pick-up efficiency of light in the same wavelength region has not always been sufficient in the fluorine-containing cured product.

To solve the above problems, LED encapsulated with a glass prepared with a sol-gel method was developed (4). This encapsulant material makes it possible to reduce hygroscopicity and decrease discoloration, and improve heat resistance. However, with sol-gel glass, fine pores are liable to remain and cracks can be easily generated. When water enters the fine pores or crack sites, it affects the performance of the LED. In general, the glass has poor adhesion when compared with a resin.

It has also been proposed that a low melting glass is heat melted, and LED is transparently encapsulated with the melt (5). However, where a low melting glass is generally heat melted, it is necessary to heat the glass to a temperature from 400 to 700° C. Therefore, a phosphor used in LED may undergo heat deterioration.

To overcome those problems, a silicone resin (polyorganosiloxane) having excellent heat resistance and ultraviolet resistance was used as a substitute of the epoxy resin. However, silicone resins up to now tend to scar easily, and are not yet sufficient when considering the combined characteristics: adhesion, colorless transparency, heat resistance, resistance to moist heat and UV tolerant (5, 6, 7, 8, 9).

With the recent development of GaN-based devices which emit short wavelength radiation such as blue light or ultraviolet light, and subsequently white light by combining these light emitting diodes with fluorescent phosphors, the material requirements for the encapsulant have significantly increased. Materials should be able to withstand exposure to radiation of high intensity UV light and temperature up to around 200° C. without degradation in optical and mechanical properties.

Therefore, there is a need for robust LED encapsulants with superior optical clarity, high temperature-resistance, UV-resistance, higher refractive index, and with variable elastic properties including adhesiveness toward the materials used on the surface of the LED packages (10, 11). The present invention allows such properties to be achieved. There is also a need for LED encapsulants with varying mechanical properties, without sacrificing their optical clarity, high temperature-resistance and UV-resistance. The present invention allows such properties to be achieved, as well.

SUMMARY OF THE INVENTION

The invention provides for semiconductor devices by encapsulating them using polyorganosiloxane composites containing elements of the $4^{th}$ and/or $13^{th}$ groups of the periodic table.

The present invention provides semiconductor devices using polyorganosiloxane composites containing elements of the $4^{th}$ and/or $13^{th}$ groups of the periodic table that can be cured far below 300° C., has excellent light transmission properties (colorless, transparent) in a wavelength region from ultraviolet to visible light, light resistance, heat resistance, resistance to moist heat and UV resistance, and does not generate cracks and peeling even in use over a long period of time. The polyorganosiloxane composites containing elements of the $4^{th}$ and/or $13^{th}$ groups of the periodic table possess excellent thermal durability at temperatures up to 400° C. These materials also have excellent long term service temperatures up to 200° C.

The polyorganosiloxane composites containing elements of the 4th and/or $13^{th}$ groups of the periodic table may be used as they are (alone), or may be used together with other materials such as solvents, adhesion promoters (e.g. epoxy containing material), and/or filler-like materials (e.g. ceramics particles, metal/metal oxide particles, oxide particles, polymeric particles, and fumed oxides particles, silica-gel, clay, talc, fumed silica and/or fumed alumina) known to those of skill in the art.

Curing of the polyorganosiloxane composites can occur either by heating at a temperature below 300° C.; more preferably below 180° C.; and even more preferably between the range of 80° C. to 180° C. The curing is not effected by exposure to atmospheric moisture and does not require dry conditions. Alternatively, such curable polyorganosiloxane composites can be cured by methods known to those of skill in the art such as, but not limited to, using UV radiation or heat.

Cross-linked polyorganosiloxane composites or composite precursors can be obtained by the reaction of a hydrosilyl-containing compound A and a vinyl or alkyne containing compound, where compound A is represented by the following general formulae:

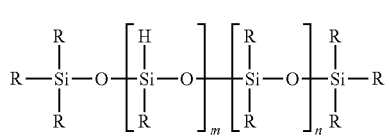

A wherein R each independently represent a group selected from hydride, alkyl, alkenyl, aryl, silyl, and condensable group like alkoxyl, hydroxyl and m and n each are an integer of 1 or more; preferably 1 to 2000 but more preferably 1-1500; and at least one hydride group is included in the molecule A for the hydrosilation to occur with a vinyl or alkyne (Rx) containing compound or compounds of formulas such as, but not limited to, A', 1A, 2A, 2A', D, D', E, E', F, F', F", H, and I:

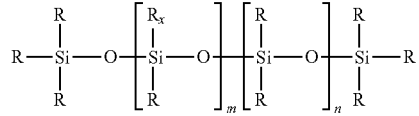

A'

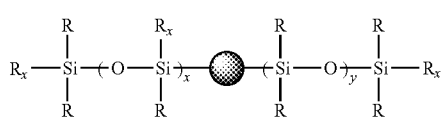

1A

2A

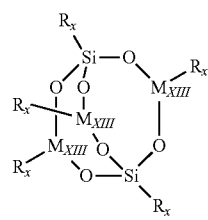

2A'

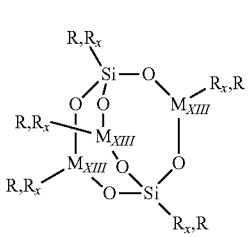

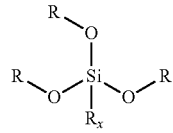

D

D'

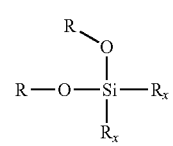

E

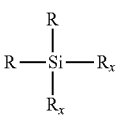

E'

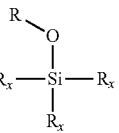

F

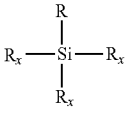

F'

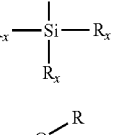

F"

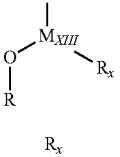

H

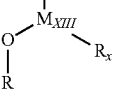

I wherein for A', 1A, 2A, 2A', D, D', E, E', F, F', F", H, I, each R independently represent a group selected from hydride, alkyl, alkenyl, aryl, silyl; $R_x$ represents an alkene or alkyne group on the molecules; and $M_{XIII}$ represents any group 13 element from the periodic table.

The alkyl, alkenyl, aryl, and silyl group may be substituted with a halogen atom. Examples of the preferred alkyl include methyl, ethyl, propyl and trifluoropropyl. An example of the preferred alkenyl includes vinyl. An example of the preferred aryl includes phenyl. An example of a preferred silyl group includes trimethylsilyl, triethylsilyl, triphenylsilyl, trimethoxysilyl, triethoxysilyl, and triphenoxysilyl groups.

For compound of formula A', the 'm' and 'n can represent an integer of between each are an integer of 1 or more; preferably 1 to 2000 but more preferably 1-1500.

For compound of formula 1A, the sphere represents carborane ($B_{10}H_{10}C_2$) which can be ortho, mew, or para carboranes; preferably metha, and 'x' and 'y' each are an integer of 0 or more; preferably 0-200 but more preferably 0-50, And preferably, Rx is vinyl. For compound 2A', the notation 'R, Rx' indicates that there is either an R or Rx at the appropriate locations on 2A'; there must be at least one Rx on 2A', and the remaining 'R, Rx' positions can be either R or Rx; and where the three $M_{XIII}$ positions on 2A and 2A' have the same group 13 element;

Examples of the above hydrosilyl-containing compound A can be one commercially available. Specific examples of these include HMS Series, DMS Series, HES Series, HDP Series, HPM Series and HAM Series, products of Gelest, Inc.: and KF-99 and KF-9901, products of Shin-Etsu Chemical Co., Ltd.

Examples of vinyl-containing compound that can be reacted with the above hydrosilyl-containing compound A, preferably contains a compound having 4 or less, preferably 3 or less and more preferably 2 or less vinyl groups in one molecule in a proportion of 50 mol % or more from the standpoint of cost and general-purpose properties. From the standpoint of increasing the degree of crosslinking and improving physical strength of a cured product, a compound with high molecular chains extended to three directions is preferred. Specifically, compounds generally called T-type silicone resin by one skilled in the art of this field can be used preferably. Furthermore, commercially available products can be used as the vinyl-containing compound. Specific examples of the vinyl-containing compound include DMS Series, PDV Series, FMV Series, VDT Series, VMS Series, VTT Series and MTV Series, products of Gelest, Inc.: X-21-5833, X-21-5837, X-21-5822, and X-22-5825, products of Shin-Etsu Chemical Co., Ltd.: ME-91, a product of Momentive Performance Materials; and Trimethoxyvinylsilane, Triethoxyvinylsilane, Dimethyldivinylsilane, Diethylmethylvinylsilane, Dimethylphenylvinylsilane, Divinylmethylphenylsilane, Methyltrivinylsilane, Phenyltrivinylsilane, Trimethylvinylsilane, Dimethoxymethylvinylsilane, Diethoxymethylvinylsilane, and Triphenylvinylsilane that are vinyl-containing silane coupling agents.

Alkyne-containing compound that can be reacted with the above hydrosilyl-containing compound A are well known to those of skill in the art, including terminal and internal alkynes as described (see Sigma-Aldrich Chemical Reagents Catalogue—http://www.sigmaaldrich.com/chemistry/chemical-synthesis/technology-spotlights/hydrosilylation-catalyst.html).

For reactions involving A and an alkene or alkyne (Rx)-containing compound or compounds of formulas such as, but not limited to, A', 1A, D, D', E, E', F, F', and F" that do not contain an element from group 4 or group 13 of the periodic table, these elements can be exogenously added to be part of the final polyorganosiloxane composite by providing these elements (e.g. Boron) in the form of additional reactants, for example, ALUMINUM 9-OCTADECENYLACETOACETATE DIISOPROPDXIDE, ALUMINUM DIISOPROPDXIDEETHYLACETOACETATE, ALUMINUM DI-s-BUTOXIDE ETHYLACETOACETATE, ALUMINUM ETHOXIDE, ALUMINUM ETHOXYETHOXYETHOXIDE, ALUMINUM ISOPROPDXIDE, ALUMINUM n-BUTOXIDE, DI-s-BUTOXYALUMINOXYTRIETHOXYSILANE, TRIETHYL(TRI-s-BUTOXY)DIALUMINUM, BORIC ACID, BORON ETHOXIDE, BORON ISOPROPDXIDE, BORON METHOXIDE, BORON N-BUTOXIDE, BORON N-PROPDXIDE, BORON T-BUTOXIDE, BORON TRIMETHYLSILOXIDE, BORON VINYLDIMETHYLSILOXIDE, DIMETHYLANILINIUM TETRAKIS(PENTAFLUOROPHENYL) BORATE, ZIRCONIUM(IV) BROMIDE, ZIRCONIUM(IV) N-BUTOXIDE, ZIRCONIUM(IV) T-BUTOXIDE, ZIRCONIUM(IV) ETHOXIDE, ZIRCONIUM(IV) I-PROPDXIDE, ZIRCONIUM(IV) N-PROPDXIDE, ZIRCONIUM DIISOPROPDXIDE BIS (2,2,6,6-TETRAMETHYL-3,5-HEPTANEDIONATE), ZIRCONIUM DIMETHACRYLATE DIBUTOXIDE, ZIRCONIUM 2-ETHYLHEXOXIDE, ZIRCONIUM 2-METHYL-2-BUTOXIDE, ZIRCONIUM 2-METHOXYMETHYL-2-PROPDXIDE, ZIRCONIUM 2,4-PENTANEDIONATE, DIALUMINUM ZIRCONIUM DOUBLE METAL ALKOXIDE.

Such reagents will then introduce these elements into the crosslinked polyorganosiloxane composite accordingly.

The result of the above addition cure system can be a crosslinked structure represented by compound with the structure N.

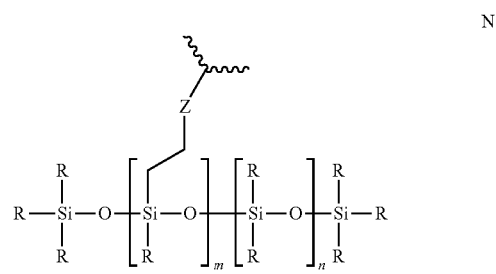

N

Where Z can represent groups derived from formulae A', 1A, 2A, 2A', D, D', E, E', F, F', F", or H, after the hydrosilylation reaction; and 'm' and 'n' represents an integer of 1 or more; preferably 1 to 2000 but more preferably 1-1500.

The amount of Z is based on the number of hydride grouping compound A. R represents a group selected from hydride, alkyl, alkenyl, aryl, siloxyl, and condensable group like hydroxyl, alkoxyl. Compound N can be used as a precursor for further reactions with other compounds with formulas, such as but not limited to D2, E2, F2, H, I, K, L, and M (see below) to obtain a crosslinked structure.

In another embodiment, semiconductor devices using cross-linked polyorganosiloxane composites can be obtained, where the composites or composite precursors are synthesized by utilizing condensation reactions involving compounds containing hydroxyl, or alkoxyl groups, represented in compounds with formulas such as, but not limited to, A", B, C,

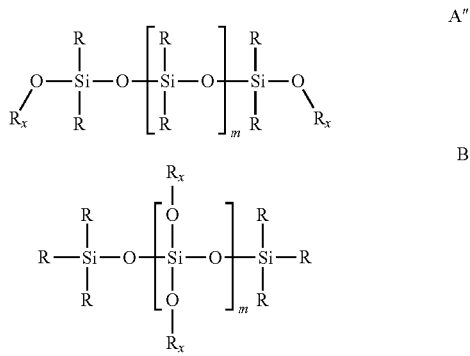

A"

B

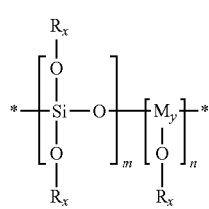

where the hydroxyl, or alkoxyl groups are represented by O—$R_x$; 'R' represents a group selected from hydride, alkyl alkenyl, aryl, hydroxyl, and siloxyl groups; $M_y$ in structure C represents any group 4 or 13 element of the periodic table; and 'm' and 'n' represents an integer from of 1 or more; preferably 1 to 2000 but more preferably 1-1500 and where structures A" and B can be either hydroxyl or alkoxyl compounds and C is an alkoxyl compound.

The alkyl, alkenyl, aryl, and silyl group may be substituted with a halogen atom. Examples of the preferred alkyl include methyl, ethyl, propyl and trifluoropropyl. An example of the preferred alkenyl includes vinyl. An example of the preferred aryl includes phenyl. An example of a preferred silyl group includes trimethylsilyl, triethylsilyl, triphenylsilyl, trimethoxysilyl, triethoxysilyl, and triphenoxysilyl groups.

As the alkoxyl groups containing compound for example, Dimethyldimethoxysilane, Dimethyldiethoxysilane, Diphenyldimethoxysilane, Diphenyldiethoxysilane, Vinyl trimethoxysilane, Vinyl triethoxysilane, Vinyl triacethoxysilane, γ-Aminopropyl trimethoxysilane, γ-Glycidoxypropyl trimethoxysilane, γ-Glycidoxypropyl triethoxysilane, β-(3,4-Epoxy cyclohexyl)ethyltrimethoxysilane, γ-(3,4-Epoxy cyclohexyl)ethyltriethoxysilane, γ-Methacryloxypropyl trimethoxysilane, Phenyl trimethoxysilane, Phenyl triacethoxysilane, γ-Mercaptopropyl trimethoxysilane, γ-Chloropropyl trimethoxysilane, β-Cyanoethyl triethoxysilane, Methyltrimethoxysilane, Methyltriethoxysilane, Methyltripropoxysilane, Methyltributoxysilane, Ethyltrimethoxysilane, Ethyltriethoxysilane, Tetramethoxysilane, Tetraethoxysilane, Tetrapropoxysilane, Tetrabutoxysilane, Dimethyldichlorosilane, Diphenyldichlorosilane, Methylphenyl dimethoxysilane, Trimethylmethoxysilane, Trimethylethoxysilane, Trimethylchlorosilane, Methyltrichlorosilane, γ-Aminopropyl triethoxysilane, 4-Aminobutyl triethoxysilane, p-Aminophenyl trimethoxysilane, N-(2-Aminoethyl)-3-aminopropyl trimethoxysilane, Aminoethyl aminomethylphenethyl trimethoxysilane, 3-Glycidoxypropyl trimethoxysilane, 2-(3,4-Epoxy cyclohexyl)ethyltrimethoxysilane, 3-Aminopropyl trimethoxysilane, 3-Aminopropyl triethoxysilane, 4-Aminobutyl triethoxysilane, N-(6-Aminohexyl)aminopropyl trimethoxysilane, 3-Chloropropyl trimethoxysilane, 3-Chloropropyltrichlorosilane, (p-Chloromethyl)phenyltrimethoxysilane, 4-Chlorophenyl trimethoxysilane, 3-Methacryloxypropyl trimethoxysilane, 3-Methacryloxypropyl triethoxysilane, 3-Acryloxypropyl trimethoxysilane, Styrylethyl trimethoxysilane, 3-Mercaptopropyl trimethoxysilane, Vinyl trichlorosilane, Vinyl tris (2-methoxyethoxy) silane, Trifluoropropyl trimethoxysilane can be used preferably.

Also as the alkoxyl group-containing oligomers, KC-89S, KR-500, X-40-9225, X-40-9246 and X-40-9250, KR-217, KR-9218, KR-213, KR-510, X-40-9227 and X-40-9247 from Shin-Etsu Chemical Co., Ltd.: PSI series from Gelest Inc. can be used preferably, too.

As for the hydroxy group-containing compound for example, XC96-723, XF3905, YF3057, YF3800, YF3802, YF3807, YF3897, YF3804, from Momentive Performance Materials, inc.: X-22-4272, X-22-6266, X-21-5841, KF-9701, and KF-353 from Shin-Etsu Chemical Co., Ltd. can be used preferably. Alternatively, Gelest Inc.'s DMS-S12, DMS-S14, PDS-1615, PDS-9931 can be used preferably, as well.

The above compounds of formulas A", B, C can be cross linked either with themselves (i.e., A" with A"; or B with B; or C with C) and/or with other compounds of formulas such as, but not limited to, D2, E2, F2, H, I, K, L, and M.

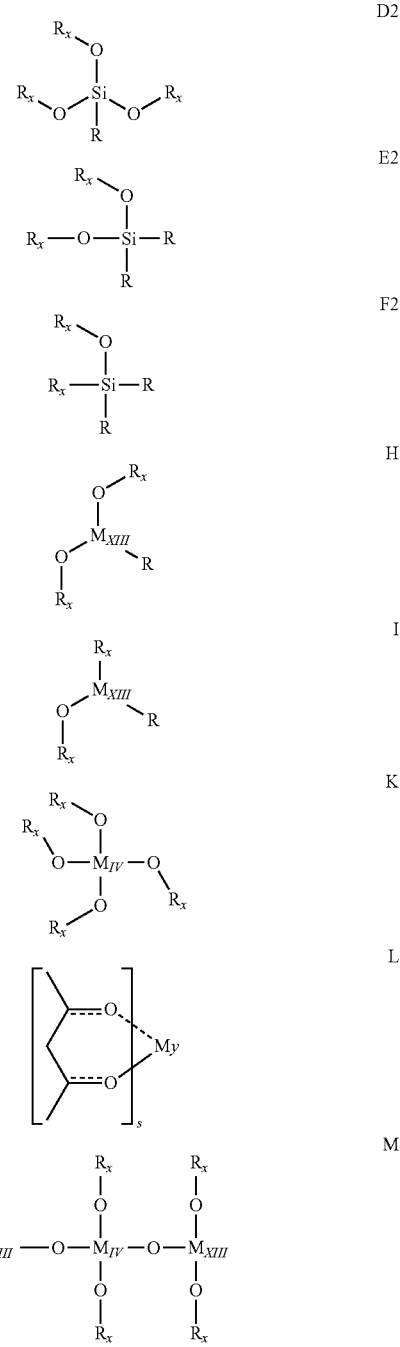

wherein R each independently represent a group selected from hydride, alkyl, alkenyl, aryl, and siloxyl groups; at least one R is alkyl, alkenyl, or aryl; O—$R_x$ represents condensable hydroxyl and alkoxyl groups; My in L represents a group 4 or 13 element of the periodic table and 's' is 3 when My is a $13^{th}$ group element, and 4 when My is a $4^{th}$ group element; $M_{XIII}$ in H, I and M represents any group 13 element of the periodic table; $M_{IV}$ in K and M represents any group 4 element of the periodic table; for M, the two $M_{XIII}$ positions have the same group 13 element; and where there is at least 0.1 wt % of the 4 or 13th group element or a combination of elements in cross-linked polyorganosiloxane composite.

For reactions involving A", and B with themselves (i.e., A" and A") and or with other compounds of formulas such as, but not limited to, D2, E2, and F2, that do not contain an element(s) from group 4, and 13 of the periodic table, the reactions can supplemented with a compound containing either an element from group 4, and 13 or any combinations thereof. Such reagents will then introduce these elements into the crosslinked polyorganosiloxane composite accordingly for example, Boric acid, or Trimethyl borate, Zirconium n-butoxide, $Zr(acac)_4$, Aluminum isopropoxide.

The result of the above condensation reactions can be products such as, but not limited, to compounds of formulas represented by O, P, Q, R, S:

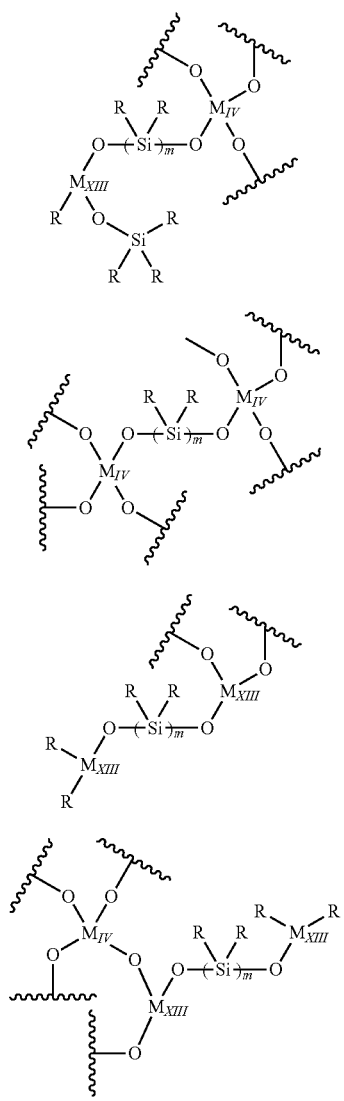

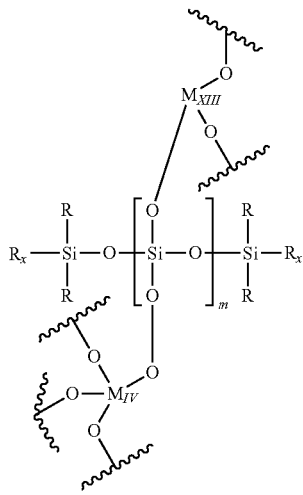

wherein, R each independently represent a group selected from hydride, alkyl alkenyl, aryl, hydroxyl, and siloxyl groups; at least one R is alkyl, alkenyl, or aryl; Rx each independently represents alkenyl, alkynyl, hydroxyl or alkoxyl; $M_{XIII}$ represents any group 13 element of the periodic table; $M_{IV}$ represents any group 4 element of the periodic table; wherein for P the two $M_{IV}$ positions do not have to have the same $M_{IV}$ element; wherein for Q and R the two $M_{XIII}$ positions do not have to have the same $M_{XIII}$ element; and 'm' is an integer from 1 or more (more preferably 1 to 500).

Compounds of formulas O, P, Q, R, S can be used as precursor material and can be reacted further with, for example with compounds of formulas A', 1A, 2A, 2A', D, D', E, E', F, F', F", H, or I (see above) to make a cross-linked polyorganosiloxane composites containing elements $4^{th}$ and/or $13^{th}$ of the periodic table.

In a preferred embodiment of the invention, semiconductor devices can be obtained using the curable polyorganosiloxane composites synthesized by hydrosilylation and or condensation reactions. In case of hydrosilylation reaction the catalyst can be removed after reaction or the catalyst can be present in the final cured composite. It is more preferable to have catalyst removed from the final cured product.

In another embodiment, the curable polyorganosiloxane composites are obtained by hydrosilation, and then cured by condensation. In yet another embodiment, curable polyorganosiloxane composites are obtained by condensation, and then cured by hydrosilation.

In a preferred embodiment of the invention, the curable polyorganosiloxane composites for semiconductor devices can be obtained with either hydrosilylation reactions using a noble metal oxide as a catalyst such as platinum, palladium, gold, osmium or ruthenium oxides. In the case of hydrosilylation, use of solid metal noble catalysts as the reaction catalyst is preferable, too. Since they can be easily removed from the reaction products, and substantially less catalyst residue is present in the curable polyorganosiloxane composite compared to when using conventional methods that rely on fixed supported catalyst, undesirable side-reactions, originating from the presence of such catalyst residue, are reduced. This contributes to markedly improved stability of a polyorganosiloxane product.

It has been further found that a noble metal oxide catalyst separately recovered can be reused, which is a preferred system industrially and economically.

In case of condensation reaction a dehydrating catalysts such as, but not limited to $Zr(acac)_4$, $Al(acac)_3$, and Tin octanoate can be used.

In yet another embodiment, silicone members for semiconductor devices are provided by curing the curable compositions of the above invention. The silicone members can be used in semiconductor luminescent devices especially as encapsulants.

In one embodiment, a curable composition comprised of the curable polyorganosiloxane composites may contain solvents, adhesion promoters (e.g. epoxy containing material), and/or filler-like materials (e.g. ceramics particles, metal/metal oxide particles, polymeric particles, especially silica-gel, clay, talc, fumed silica and/or fumed alumina) known to those of skill in the art.

As a result of extensive and intensive investigations, it has been found that a polyorganosiloxane composite which includes some amount of the $4^{th}$ and/or $13^{th}$ group elements of the periodic table or combinations of both can satisfy the above objects. Such additives were found to enhance the heat and UV durability of the silicones and increase their adhesiveness toward the surface of LED packages, metallic, ceramics, and specifically polymeric packages. As indicated above, the polyorganosiloxane composite in this invention can be produced by taking advantage of hydrosilylation, condensation reactions and/or any other chemical reactions known.

Among condensation reactions, the most preferable reactions are between metal alkoxides of the $4^{th}$ and $13^{th}$ groups, and alkoxysilyl and hydroxysilyl groups. It can also be carried out between alkoxysilyl and hydroxysilyl, and can also be carried out between alkoxysilyl and alkoxysilyl, and between hydroxysilyl and hydroxysilyl.

In one embodiment, a single metal alkoxyl group bearing compound, for example compounds of formulas C, H, I, and K can be used to introduce a $4^{th}$ and/or $13^{th}$ group of the periodic table into the polyorganosiloxane composite.

In another embodiment, a multiple metal alkoxy group bearing compound, for example compounds of formulas 2A, P and Q can be used to introduce either of the $4^{th}$ and/or $13^{th}$ group element of the periodic table into the polyorganosiloxane composite.

In a more preferred embodiment, compounds bearing mixed metal alkoxides of different metals, for example compounds of formulas M, O, R, and S can be used to tune and increase the thermal stability and the physical properties of the cured sample.

For curing, any reaction mechanism above mentioned can be used as well as equilibrium reaction which includes detachment and reconstruction of Si—O bond and/or Si—C bonds at high temperature with/without catalyst.

The invention also allows for the mechanical properties of the elastomeric resins to be varied and/or tuned to the desired stiffness, toughness and flexibility that best suit the specific application. The system offers a range of material platforms that fulfill all of the requirements and function as advanced encapsulating materials for both LED devices, as well as other emerging applications.

The polyorganosiloxane composites of the invention are suitable for use not only in the LED field, but also for example as materials for the aerospace industry that requires various properties such as light transmission properties (colorless transparency), light resistance, heat resistance, resistance to moist heat and UV resistance, and resistance to other materials. For example, as a material for aerospace industry, the polyorganositoxane is combined with a carbon-based nanomaterial to form a composite, and such a composite can be used as a material for removing static electricity, a conductive adhesive, a gasket material, a flash defensive material, an electromagnetic shielding material, a tank material, a rocket outer material, bio-medical applicaions and the like.

The polyorganosiloxane composites of this invention are also suitable for use in photovoltaic encapsulation where the active absorber is encapsulated between the top transparent film and the bottom "back sheet". Active material can include but not limited to, copper indium gallium selenide, bulk heterojunction organic, polycrystalline silicon, amorphous silicon and dye sensitized.

BRIEF DESCRIPTION OF THE DRAWINGS

For a more complete understanding of the present invention, reference is now made to the following descriptions taken in conjunction with the accompanying drawing, in which.

Figure 1:
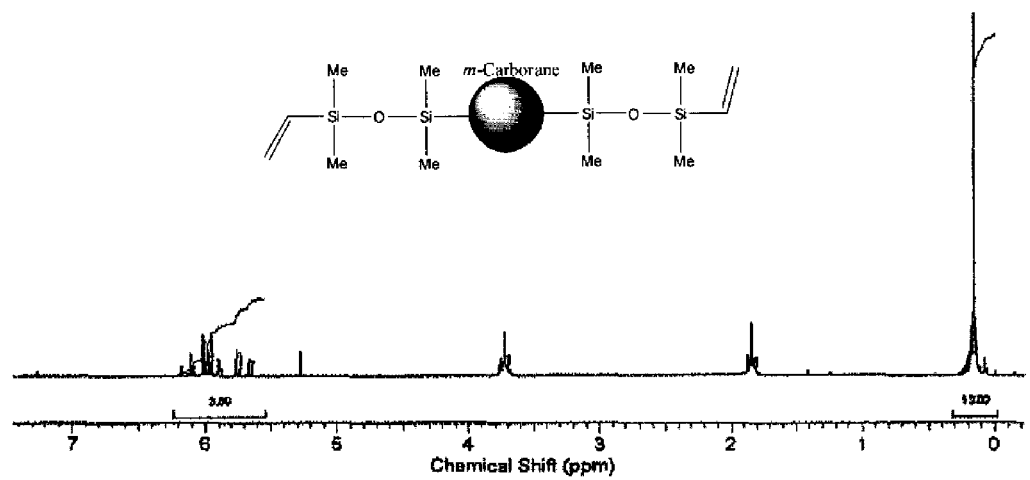
FIG. 1 shows $^1$H-NMR spectrum of one example of m-Carborane based modifier.

Table 1 gives the resin properties obtained in Example 2 depend on the loading amount of m-Carborane and RTV-615 hardener.

Table 2 gives the list of the polyorganosiloxane resins synthesized with/without the m-Carborane modifier in Example 3-2.

Table 3 gives the list of the polyorganosiloxane composites prepared with boron containing material (Trimethyl borate) with/without zirconium containing materials in Example 4.

Scheme 1 shows a general synthetic example of polyorganosiloxanes using hydrosilylation.

Scheme 2 shows the synthetic approach of m-Carborane containing modifier leads to one boron containing group (1A).

Scheme 3 shows the synthetic approach of a Boro-silicate-cage-shaped modifier leads to other boron containing groups (2A) and (2A').

DETAILED DESCRIPTION OF THE INVENTION

The invention provides semiconductor devices using polyorganosiloxane composites that can be cured by heat in the presence of at least 0.1 wt % of the $4^{th}$ and/or $13^{th}$ group elements in the periodic table. Polyorganosiloxane composites produced by the above method have excellent adhesion, transparency, resistance to moist heat and UV resistance, and are therefore useful in various applications such as an encapsulation resin of LED.

The total content of the $4^{th}$ and/or $13^{th}$ group elements in the periodic table can be between 0.1 wt % and 80 wt %; 0.5 wt % and 80 wt %; 1.0 wt % and 80 wt %; preferably, between 0.1 wt % and 50 wt %; 0.5 wt % and 50 wt %; 1.0 wt % and 50 wt %; more preferably between 0.1 wt % and 10 wt %; 0.5 wt % and 10 wt %; and 1.0 wt % and 10 wt %. If the content is more than 80 wt %, the tuning of the physical properties of resins become very difficult.

The $4^{th}$ group (titanium, zirconium, hafnium) or the $13^{th}$ group (boron, aluminium, gallium, indium, thallium) elements especially boron, aluminum, or zirconium containing material usually has higher refractive index than normal polyorganosiloxanes. And adding such elements in a polyorganosiloxane composite is preferable because they can increase the overall refractive index and lead to higher light extraction when it is used as an encapsulating material of LED.

In another embodiment, the polyorganosiloxane composites for the semiconductor devices can be produced by either hydrosilylation or condensation reactions of raw materials possessing average molecular weights of 3,000 or more. In a more specific embodiment, the weight average molecular weight determinations are obtained by measuring with GPC (gel permeation chromatography) using a polystyrene standard material in calibration curve measurement.

Scheme 1 represents one general procedure of the preparation of the silicone-based resin backbone which involves the functionalization/modification of a methylhydrido-poly-dimethylsiloxane (H-PDMS) using for example hydrosilylation. High molecular weight vinyl silanes are preferably incorporated along the polysiloxane backbone by hydrosilylation using a solid $PtO_2$ catalyst, for example. Homogeneous catalyst can be used without any problem but solid catalyst is also preferably used and it can be removed simply by centrifugation or filtration after the reaction. This subsequent catalyst-free, PDMS-based liquid resin is unique and different from other conventional PDMS-based resins include homogeneous catalysts. See for example U.S. Pat. No. 7,160,972 B2 that discloses a polysiloxane-based resin typically employing hydrosilylation curing chemistry. Such resin type requires 2-part systems, where part A contains the platinum catalyst together with vinylsiloxane copolymer and part B is the hydridosiloxane copolymer.

And for example in the patent WO 2008/018981 A2 (15), they claim silicone composites including Boron, Aluminum, and/or Titanium. But none of the silicon elements of their backbones have alkyl, alkenyl, alkynyl, or aryl functional group directly attached on Si, the overall material should be physically very hard and/or brittle and they are not suitable for using as an encapsulating material of a LED.

Scheme 1.
A general synthetic example of polyorganosiloxanes using hydrosilylation.

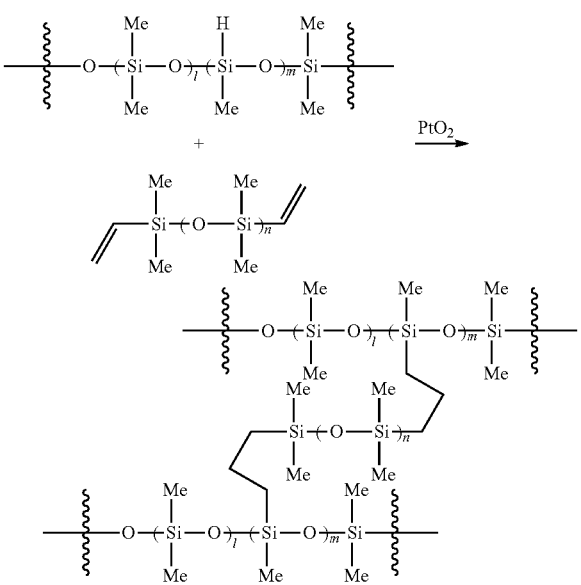

One key point of this invention is simplicity and functionality. The one-pot nature of the formulation can make the system very attractive. Additionally, the catalyst-free system, when solid metal oxide catalysts were applied, eliminates problems that may arise due to unwanted side reactions related to the catalyst residue.

Scheme 2 illustrates the synthetic approach of materials with boron containing group 1A. The method is very simple and straightforward as described in the experimental section (16, 17).

Scheme 2.
Synthesis of m-Carborane containing modifier that can be used for the synthesis of 1A.

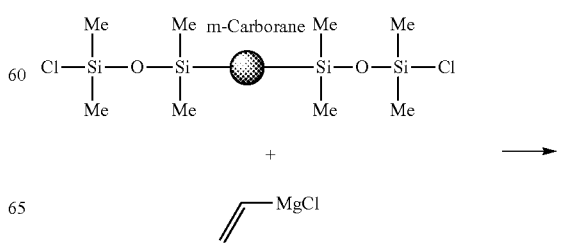

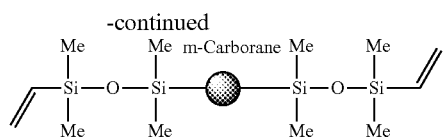

Scheme 3 illustrates the synthetic example of cage shaped materials with boron containing groups. The synthetic approach is again very straightforward as depicted in the experimental section.

Scheme 3.
Synthesis of Boro-silicate-cage-shaped modifier that can be used for the synthesis of 2A and 2A'.

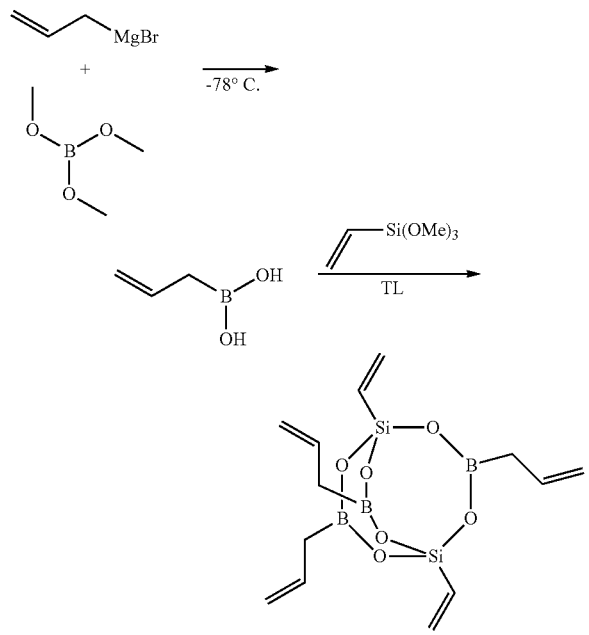

Combined Use with Other Members

The semiconductor device member using the high performance polyorganosiloxane of the present invention may be utilized for example as an encapsulating member by itself. However, it may also be used together with another member for more complete cutoff of oxygen or moisture for example when it encapsulates phosphors that is liable to deteriorate by oxygen or moisture, a semiconductor light-emitting device or the like. In such a case, an air-tight sealing, using such a highly air-tight sealant as glass plate or epoxy resin, or vacuum sealing may be added from outside of the member of the present invention, which is provided for retention of the phosphor, encapsulation of the semiconductor element or extracting light. In this case, the shape of the device is not specially limited. Namely, it is enough for the sealant, coating or coated layer, made of the semiconductor device member of the present invention, to be substantially protected and blocked from outside by an air-tight material such as metal, glass or highly air-tight resin, so as to allow no passage of oxygen and moisture.

In addition, the semiconductor device member of the present invention may be used as adhesive agent for a semiconductor device because it excels in adhesion as described above. More specifically, for example, the semiconductor device member of the present invention can be used for bonding a semiconductor element and a package, a semiconductor element and a sub mount, package constituents together, a semiconductor device and an external optical element, by means of application, printing or potting. Since the semiconductor device member of the present invention excels particularly in light resistance and heat resistance, it provides a semiconductor light-emitting device with high reliability enough to stand a long-time use, when it is used as adhesive agent for a high-power semiconductor light-emitting device that is exposed to high temperature or ultraviolet rays for a long time.

The semiconductor device member of the present invention can achieve sufficient adhesion just by itself. However, for more sufficient adhesion, various surface treatments for improving adhesion may be performed on the surface that will be directly in contact with the semiconductor device member. Examples of such surface treatment include: a formation of an adhesion-improving layer using a primer or a silane coupling agent, a chemical surface treatment using such an agent as acids or bases, a physical surface treatment using plasma irradiation, ion irradiation or electron beam irradiation, a surface-roughening procedure by sandblasting, etching or microparticles coating. Other examples of the surface treatment for improving adhesion include known surface treatment methods such as described in Japanese Patent Laid-Open Publication (Kokai) No. Hei 5-25300 (12), "Hyomen Kagaku", Vol. 18 No. 9, pp 21-26, written by Norihiro Inagaki (13), and "Hyomen Kagaku", Vol. 19 No. 2, pp 44-51 (1998), written by Kazuo Kurosaki (14).

Semiconductor Light-Emitting Device

Recently due to the high speed development of LED technology as well as the higher and/or more complicated request of the consumers, the power output (close to or over 1 W) and the brightness of LED devices tend to become higher and higher. And with this tendency, members of LED must be more and more durable against heat, UV, etc.

Package

The package used in the semiconductor light-emitting device of the present invention is characterized in that the surface material thereof contains one or more of Si, Al and Ag or consists of Polyphthalamide or Liquid crystal polymers. In this context, the "package" means a member in the semiconductor light-emitting device, on which the semiconductor element, to be described later, is mounted. Shapes of the package include: a cup shape, a flat plate with a recess formed therein, a flat plate with a weir formed therearound, and a flat plate. A cup-shaped one is usually used.

Surface Material

The surface material of the package used in the semiconductor light-emitting device of the present invention is characterized in that it contains one or more of Si, Al and Ag, or consists of Polyphthalamide or Liquid crystal polymers.

The package is a member on which the semiconductor element is mounted, as described above. Various surface treatments are provided thereon for the purpose of improving brightness (reflectance), durability/heat resistance, light resistance, adhesion, heat dissipating property and the like.

Particularly in a power device, it is often subjected to a surface treatment and the material thereof is often selected for the purpose of improving durability and heat resistance.

The concrete examples include: a surface treatment such as silver plating for improving the reflectance and the brightness, or the like; a selection of a ceramic package based on $SiN_x$, SiC, $SiO_2$, Al, AlN, $Al_2O_3$ or a selection of a plastic package based on Polyphthalamide or Liquid crystal polymers for improving heat dissipating property, insulation property, heat resistance, durability, light resistance and the like; and a treatment of the ceramic or plastic surface such as surface smoothing or roughening by means of forming an inorganic coating layer for improving the reflectance or adding the light diffusivity.

Even when utilizing a package with such specific surface treatments, the semiconductor light-emitting device of the present invention exhibits excellent characteristics without such a problem of peeling of its encapsulant.

The content of Si and Al contained in the surface material of the package used in the semiconductor light-emitting device of the present invention is, in the surface material, preferably 5 weight % or more, more preferably 10 weight % or more, and further preferably 40 weight % or more, and usually 100 weight % or less, preferably 90 weight % or less, and more preferably 80 weight % or less. The above-mentioned content indicates the total content of Si and Al, in a surface where $SiO_2$ and $Al_2O_3$ are solid-solved and mixed, such as a surface of an $Al_2O_3$ ceramic sintered compact using $SiO_2$ as sintering agent. On the other hand, in a surface of a material comprising two layers, such as a reinforced plastic containing an inorganic filler like a glass fiber, it indicates the Si content in the reinforced plastic. Ag exists frequently at a high purity as a plated metal in the semiconductor light-emitting device. The Ag content in an Ag-containing surface is usually 60 weight % or more, preferably 70 weight % or more, more preferably 80 weight % or more, and usually 100 weight % or less, preferably 98 weight % or less, more preferably 95 weight % or less. When the above-mentioned content is too small, there is a possibility of failing in achieving various advantageous effects of the surface treatment or the like. When it is too large, it is possible that the manipulation is obstructed or the ceramic composition deviates from the intended one.

Other Materials

The aforementioned surface material constitutes the whole of or a part of the material of the package used in the semiconductor light-emitting device of the present invention. The other material than the surface material contained partially in the package can be selected arbitrarily according the purpose. It can be usually selected to be used from organic materials, inorganic materials, glass materials and combinations of them, as appropriate.

The organic materials include: organic resins such as Polycarbonate resin, Polyphenylene sulfide resin, Epoxy resin, Acrylic resin, Silicone resin, ABS (Acrylonitrile-butadienestyrene) resin, Nylon resin, Polyphthalamide resin, Liquid crystal polymers, and Polyethylene resin; and reinforced plastics such as those in which such organic resins and a glass filler or an inorganic powder are mixed for improvement in heat resistance or mechanical strength and decrease in thermal expansion coefficient.

The inorganic materials include: ceramics materials such as $SiN_x$, SiC, $SiO_2$, AlN and $Al_2O_3$; metal materials such as Iron, Copper, Brass, Aluminium, Nickel, Gold, Silver, Platinum, and Palladium; and their alloys.

The glass materials include: low-melting glasses used for a hermetic seal part or an adhesion between members; and optical glasses used as a part of the package such as a window or a transparent lid of the package.

When the semiconductor light-emitting device of the present invention is used in a so-called power device, which is high in amount of heat generation and luminescence, materials having higher durabilities than semiconductor light-emitting devices of the conventional constitutions can be selected. In such a power device, inorganic materials, which are superior in durabilities such as heat resistance and light (UV) resistance, are more preferable than organic materials, which are prone to deterioration such as discoloration. In particular, materials superior in workability and heat dissipating property, such as Copper, Aluminium, $SiN_x$, AlN, $Al_2O_3$, are preferable. In addition, various surface treatments such as Silver plating may be provided onto these package materials for the purpose of improving the reflectance, and thus the brightness.

Uses of the Semiconductor Light-emitting Device Members Made with the Polyorganosiloxanes of the Invention The semiconductor light-emitting device member in the present invention is not particularly limited in its use and can be used for various purposes including as a member for sealing/encapsulating a semiconductor light-emitting device. By combining with phosphor particles and/or inorganic oxide particles, the polyorganosiloxane composites of this invention are suitably used for the encapsulant of the semiconductor light-emitting device. The combined use with phosphor particles is described below.

Combined Use with Phosphor Particles

The polyorganosiloxane composites for the semiconductor devices in the present invention can be used, for example, as a wavelength conversion member by dispersing a phosphor and molding them inside the semiconductor light-emitting device cup or coating as a thin film on the semiconductor light-emitting device directly or indirectly with some appropriate transparent support between them. One phosphor may be used alone or two or more types of phosphors may be used in an arbitrary combination and ratio for example to make the overall light 'white'.

Phosphors

Composition of the phosphor is not particularly limited, but it is preferable to combine a crystalline matrix, for example, metallic oxide such as $Y_2O_3$ and $Zn_2SiO_4$, phosphate such as $Ca_5(PO_4)_3Cl$, or sulfide such as ZnS, SrS, and CaS with ions of rare earth metal such as Ce, Pr, Nd, Pm, Sm, Eu, Tb, Dy, Ho, Er, Tm, and Yb or ions of metal such as Ag, Cu, Au, Al, Mn, and Sb as an activator or coactivator.

Preferable examples of the crystalline matrix include sulfide such as (Zn, Cd)S, $SrGa_2S_4$, SrS, and ZnS, oxysulfide such as $Y_2O_2S$, aluminate such as $(Y, Gd)_3Al_5O_{12}$, $YAlO_3$, $BaMgAl_{10}O_{17}$, $(Ba, Sr)(Mg, Mn)Al_{10}O_{17}$, $(Ba, Sr, Ca)(Mg, Zn, Mn)Al_{10}O_{17}$, $BaAl_{12}O_{19}$, $CeMg Al_{11}O_{19}$, $(Ba, Sr, Mg)O.Al_2O_3$, $BaAl_2Si_2O_8$, $SrAl_2O_4$, $Sr_4Al_{14}O_{25}$, and $Y_3Al_5O_{12}$, silicate such as $Y_2SiO_5$ and $Zn_2SiO_4$, oxide such as $SnO_2$ and $Y_2O_3$, borate such as $GdMgB_5O_{10}$, $(Y, Gd)BO_3$, halophosphate such as $Ca_{10}(PO_4)_6(F, Cl)_2$ and $(Sr, Ca, Ba, Mg)_{10}(PO_4)_6Cl_2$ and phosphate such as $Sr_2P_2O_7$ and $(La, Ce)PO_4$.

However, the above crystalline matrix and the activator or coactivator are not particularly limited in elemental composition and can partially be substituted by analogous elements, and a resultant phosphor can be used if it absorbs light in the near-ultraviolet to visible region and emits visible light.

More specifically, substances shown below can be used as a phosphor, but these are only exemplary substances and phosphors that can be used in the present invention are not limited to these. In the exemplification shown below, phosphors whose structure is different only partially are shown in an abbreviated manner when appropriate. For example, "$Y_2SiO_5:Ce^{3+}$", "$Y_2SiO_5:Tb^{3+}$", and "$Y_2SiO_5:Ce^{3+}, Tb^{3+}$" are shown in a unifying manner as "$Y_2SiO_5:Ce^{3+}, Tb^{3+}$", and "$La_2O_2S:Eu$", "$Y_2O_2S:Eu$" and "$(La, Y)_2O_2S:Eu$" are shown in a unifying manner as "$(La, Y)_2O_2S:Eu$". An abbreviated location is delimited by a comma (,).

Red Phosphor

The range of concrete wavelengths of fluorescence emitted by a phosphor that emits red fluorescence (hereinafter referred to as a "red phosphor" when appropriate) is exemplified as usually 570 nm or more, preferably 580 nm or more, and usually 700 nm or less, preferably 680 nm or less.

Such red phosphors include a europium activation alkaline earth silicon nitride phosphor represented by (Mg, Ca, Sr, Ba)$_2$Si$_5$N$_8$:Eu and configured by fracture particles having a red fracture surface to emit light in the red region and europium activation rare earth oxychalcogenide phosphor represented by (Y, La, Gd, Lu)$_2$O$_2$S:Eu and configured by grown particles having approximately a spherical shape as a regular crystal growth shape to emit light in the red region.

Further, a phosphor containing oxynitride and/or oxysulfide containing at least one element selected from a group consisting of Ti, Zr, Hf, Nb, Ta, W, and Mo disclosed by Japanese Patent Application Laid-Open No. 2004-300247 and containing an α-sialon structure in which part or all of Al elements are substituted by the Ga elements can also be used in the present embodiment. Such a phosphor is a phosphor containing oxynitride and/or oxysulfide.

As other red phosphors, an Eu activation oxysulfide phosphor such as (La, Y)$_2$O$_2$S:Eu, Eu activation oxide phosphor such as Y(V, P)O$_4$:Eu and Y$_2$O$_3$:Eu; Eu, Mn activation silicate phosphor such as (Ba, Sr, Ca, Mg)$_2$SiO$_4$:Eu, Mn and (Ba, Mg)$_2$SiO$_4$:Eu, Mn; Eu activation sulfide phosphor such as (Ca, Sr)S:Eu, Eu activation aluminate phosphor such as YAlO$_3$:Eu, Eu activation silicate phosphor such as LiY$_9$(SiO$_4$)$_6$O$_2$:Eu, Ca$_2$Y$_8$(SiO$_4$)$_6$O$_2$:Eu, (Sr, Ba, Ca)$_3$SiO$_5$:Eu, and Sr$_2$BaSiO$_5$:Eu, Ce activation aluminate phosphor such as (Y, Gd)$_3$Al$_5$O$_{12}$:Ce and (Tb, Gd)$_3$Al$_5$O$_{12}$:Ce, Eu activation nitride phosphor such as (Ca, Sr, Ba)$_2$Si$_5$N$_8$:Eu, (Mg, Ca, Sr, Ba)SiN$_2$:Eu, and (Mg, Ca, Sr, Ba)AlSiN$_3$:Eu, Ce activation nitride phosphor such as (Mg, Ca, Sr, Ba)AlSiN$_3$:Ce; Eu, Mn activation halophosphate phosphor such as (Sr, Ca, Ba, Mg)$_{10}$(PO$_4$)$_6$Cl$_2$:Eu, Mn; Eu, Mn activation silicate phosphor such as (Ba$_3$Mg)Si$_2$O$_8$:Eu, Mn and (Ba, Sr, Ca, Mg)$_3$(Zn, Mg)Si$_2$O$_8$:Eu, Mn; Mn activation germanide phosphor such as 3.5MgO.0.5MgF$_2$.GeO$_2$:Mn, Eu activation oxynitride phosphor such as Eu activation α-sialon; Eu, Bi activation oxide phosphor such as (Gd, Y, Lu, La)$_2$O$_3$:Eu, Bi; Eu, Bi activation oxysulfide phosphor such as (Gd, Y, Lu, La)$_2$O$_2$S:Eu, Bi; Eu, Bi activation vanadate phosphor such as (Gd, Y, Lu, La)VO$_4$:Eu, Bi; Eu, Ce activation sulfide phosphor such as SrY$_2$S$_4$:Eu, Ce; Ce activation sulfide phosphor such as CaLa$_2$S$_4$:Ce; Eu, Mn activation phosphate phosphor such as (Ba, Sr, Ca)MgP$_2$O$_7$:Eu, Mn and (Sr, Ca, Ba, Mg, Zn)$_2$P$_2$O$_7$:Eu, Mn; Eu, Mo activation tungstate phosphor such as (Y, Lu)$_2$WO$_6$:Eu, Mo; Eu, Ce activation nitride phosphor such as (Ba, Sr, Ca)$_x$Si$_y$N$_z$:Eu, Ce (x, y, and z are integers equal to 1 or greater); Eu, Mn activation halophosphate phosphor such as (Ca, Sr, Ba, Mg)$_{10}$(PO$_4$)$_6$(F, Cl, Br, OH):Eu, Mn and Ce activation silicate phosphor such as ((Y, Lu, Gd, Tb)$_{1-x}$Sc$_x$Ce$_y$)$_2$(Ca, Mg)$_{1-r}$(Mg, Zn)$_{2+r}$Si$_{z-q}$Ge$_q$O$_{12+\delta}$ can also be used.

Also as a red phosphor, a red organic phosphor comprised of rare earth element ion complexes having anions such as β-diketonate, β-diketone, aromatic carboxylic acid, and Broensted acid as ligands, perylene pigment (for example, dibenzo{[f, f']-4,4',7,7'-tetraphenyl}diindeno[1,2, 3-cd:1',2', 3'-lm]perylene), anthraquinone pigment, lake pigment, azo pigment, quinacridone pigment, anthracene pigment, isoindoline pigment, isoindolinone pigment, phthalocyanine pigment, triphenylmethane basic dye, indanthrone pigment, indophenol pigment, cyanine pigment, and dioxazine pigment can also be used.

Also, among red phosphors, those whose peak wavelength is 580 nm or more, preferably 590 nm or more, and 620 nm or less, preferably 610 nm or less can be suitably used as an orange phosphor. Examples such orange phosphors include (Sr, Ba)$_3$SiO$_5$:Eu, (Sr, Mg)$_3$(PO$_4$)$_2$: Sn$^{2+}$, and SrCaAlSiN$_3$:Eu.

Green Phosphor

The range of concrete wavelengths of fluorescence emitted by a phosphor that emits green fluorescence (hereinafter referred to as a "green phosphor" when appropriate) is exemplified as usually 490 nm or more, preferably 500 nm or more, and usually 570 nm or less, preferably 550 nm or less.

Such green phosphors include a europium activation alkaline earth silicon oxynitride phosphor represented by (Mg, Ca, Sr, Ba)Si$_2$O$_2$N$_2$:Eu and configured by fracture particles having a fracture surface to emit light in the green region and europium activation alkaline earth silicate phosphor represented by (Ba, Ca, Sr, Mg)$_2$SiO$_4$:Eu and configured by fracture particles having a fracture surface to emit light in the green region.

As other green phosphors, an Eu activation aluminate phosphor such as Sr$_4$Al$_{14}$O$_{25}$:Eu and (Ba, Sr, Ca)Al$_2$O$_4$:Eu, Eu activation silicate phosphor such as (Sr, Ba)Al$_2$Si$_2$O$_8$: Eu, (Ba, Mg)$_2$SiO$_4$:Eu, (Ba, Sr, Ca, Mg)$_2$SiO$_4$:Eu, and (Ba, Sr, Ca)$_2$(Mg, Zn)Si$_2$O$_7$:Eu; Ce, Tb activation silicate phosphor such as Y$_2$SiO$_5$:Ce, Tb, Eu activation boric acid phosphate phosphor such as Sr$_2$P$_2$O$_7$—Sr$_2$B$_2$O$_5$:Eu, Eu activation halosilicate phosphor such as Sr$_2$Si$_3$O$_8$-2SrCl$_2$:Eu, Mn activation silicate phosphor such as Zn$_2$SiO$_4$:Mn, Tb activation aluminate phosphor such as CeMgAl$_{11}$O$_{19}$:Tb and Y$_3$Al$_5$O$_{12}$:Tb, Tb activation silicate phosphor such as Ca$_2$Y$_8$(SiO$_4$)$_6$O$_2$:Tb and La$_3$Ga$_5$SiO$_{14}$:Tb; Eu, Tb, Sm activation thiogallate phosphor such as (Sr, Ba, Ca)Ga$_2$S$_4$: Eu, Tb, Sm; Ce activation aluminate phosphor such as Y$_3$(Al, Ga)$_5$O$_{12}$:Ce and (Y, Ga, Tb, La, Sm, Pr, Lu)$_3$(Al, Ga)$_5$O$_{12}$:Ce, Ce activation silicate phosphor such as Ca$_3$Sc$_2$Si$_3$O$_{12}$:Ce and Ca$_3$(Sc, Mg, Na, Li)$_2$Si$_3$O$_{12}$:Ce, Ce activation oxide phosphor such as CaSc$_2$O$_4$:Ce, Eu activation oxynitride phosphor such as SrSi$_2$O$_2$N$_2$:Eu, (Sr, Ba, Ca)Si$_2$O$_2$N$_2$:Eu, and Eu activation β-siaion and Eu activation α-sialon; Eu, Mn activation aluminate phosphor such as BaMgAl$_{10}$O$_{17}$:Eu, Mn; Eu activation aluminate phosphor such as SrAl$_2$O$_4$:Eu, Tb activation oxysulfide phosphor such as (La, Gd, Y)$_2$O$_2$S:Tb; Ce, Tb activation phosphate phosphor such as LaPO$_4$:Ce, Tb; sulfide phosphor such as ZnS:Cu, Al and ZnS:Cu, Au, Al; Ce, Tb activation borate phosphor such as (Y, Ga, Lu, Sc, La)BO$_3$: Ce, Tb; Na$_2$Gd$_2$B$_2$O$_7$:Ce, Tb; and (Ba, Sr)$_2$(Ca, Mg, Zn)B$_2$O$_6$:K, Ce, Tb; Eu, Mn activation halosilicate phosphor such as Ca$_8$Mg(SiO$_4$)$_4$Cl$_2$:Eu, Mn; Eu activation thioaluminate phosphor and thiogallate phosphor such as (Sr, Ca, Ba)(Al, Ga, In)$_2$S$_4$:Eu, and Eu, Mn activation halosilicate phosphor such as (Ca, Sr)$_8$(Mg, Zn)(SiO$_4$)$_4$Cl$_2$:Eu, Mn can also be used.

Also, organic phosphors such as a pyridine-phthalimide condensation derivative, fluorescent dyes such as benzooxazinone, quinazolinone, coumarin, quinophthalone, and naphthalate imide, and terbium complex having hexylsalicylate as a ligand can be used as a green phosphor.

Blue Phosphor

The range of concrete wavelengths of fluorescence emitted by a phosphor that emits blue fluorescence (hereinafter referred to as a "blue phosphor" when appropriate) is exemplified as usually 420 nm or more, preferably 440 nm or more, and usually 480 nm or less, preferably 470 nm or less.

Such blue phosphors include a europium activation barium-magnesium aluminate phosphor represented by BaMgAl$_{10}$O$_{17}$:Eu and configured by grown particles having approximately a hexagonal shape as a regular crystal growth shape to emit light in the blue region, europium activation calcium halophosphate phosphor represented by (Ca, Sr, Ba)$_5$ (PO$_4$)$_3$Cl:Eu and configured by grown particles having approximately a spherical shape as a regular crystal growth shape to emit light in the blue region, europium activation alkaline earth chloroborate phosphor represented by (Ca, Sr, Ba)$_2$B$_5$O$_9$Cl:Eu and configured by grown particles having approximately a cubic shape as a regular crystal growth shape to emit light in the blue region, and europium activation alkaline earth aluminate phosphor represented by (Sr, Ca, Ba)Al$_2$O$_4$:Eu or (Sr, Ca, Ba)$_4$Al$_{14}$O$_{25}$:Eu and configured by fracture particles having a fracture shape to emit light in the blue region.

As other blue phosphors, an Sn activation phosphate phosphor such as Sr$_2$P$_2$O$_7$:Sn, Eu activation aluminate phosphor such as Sr$_4$Al$_{14}$O$_{25}$:Eu, BaMgAl$_{10}$O$_{17}$:Eu, and BaAl$_8$O$_{13}$:Eu, Ce activation thiogallate phosphor such as SrGa$_2$S$_4$:Ce and CaGa$_2$S$_4$:Ce, Eu activation aluminate phosphor such as (Ba, Sr, Ca)MgAl$_{10}$O$_{17}$:Eu and BaMgAl$_{10}$O$_{17}$:Eu, Tb, Sm; Eu, Mn activation aluminate phosphor such as (Ba, Sr, Ca)MgAl$_{10}$O$_{17}$:Eu, Mn; Eu activation halophosphate phosphor such as (Sr, Ca, Ba, Mg)$_{10}$(PO$_4$)$_6$Cl$_2$:Eu and (Ba, Sr, Ca)$_5$(PO$_4$)$_3$(Cl, F, Br, OH):Eu, Mn, Sb; Eu activation silicate phosphor such as BaAl$_2$Si$_2$O$_8$:Eu and (Sr, Ba)$_3$MgSi$_2$O$_8$:Eu, Eu activation phosphate phosphor such as Sr$_2$P$_2$O$_7$:Eu, sulfide phosphor such as ZnS:Ag and ZnS:Ag, Al; Ce activation silicate phosphor such as Y$_2$SiO$_5$:Ce, tungstate phosphor such as CaWO$_4$, Eu, Mn activation boric acid phosphate phosphor such as (Ba, Sr, Ca)BPO$_5$:Eu, Mn, (Sr, Ca)$_{10}$(PO$_4$)$_6$·nB$_2$O$_3$:Eu, and 2SrO·0.84P$_2$O$_5$·0.16B$_2$O$_3$:Eu, and Eu activation halosilicate phosphor such as Sr$_2$Si$_3$O$_8$·2SrCl$_2$:Eu can also be used.

Also, organic phosphors such as a fluorescent dye of naphthalate imide, benzooxazole, styryl, coumarin, pilarizon, and triazole compounds and thulium complexes can be used as a blue phosphor.

One phosphor may be used alone or two or more types of phosphors may be used in an arbitrary combination and ratio.

A media particle diameter of these phosphor particles is not particularly limited, but is usually 100 nm or more, preferably 2 μm or more, and still preferably 5 μm or more, and usually 100 μm or less, preferably 50 μm or less, and still preferably 20 μm or less. Also, the shape of phosphor particles is not particularly limited as long as formation of semiconductor light-emitting device members are not affected, for example, fluidity of a phosphor part formation liquid (liquid obtained by adding a phosphor to this invention's semiconductor light-emitting device member formation liquid) is not affected.

In the present invention, the method of adding phosphor particles is not particularly limited. If phosphor particles are in a good dispersion state, it is sufficient only to post-mix phosphor particles into the semiconductor light-emitting device member formation liquid. If phosphor particles tend to aggregate, they can be mixed in advance into the raw materials before the synthesis of the present invention's polyorganosiloxane composite.

The present invention is described further specifically by the Examples, but it should be understood that the invention is not limited to the following Examples so far as the invention is not beyond its gist.

EXAMPLES

Example 1

Figure 2:
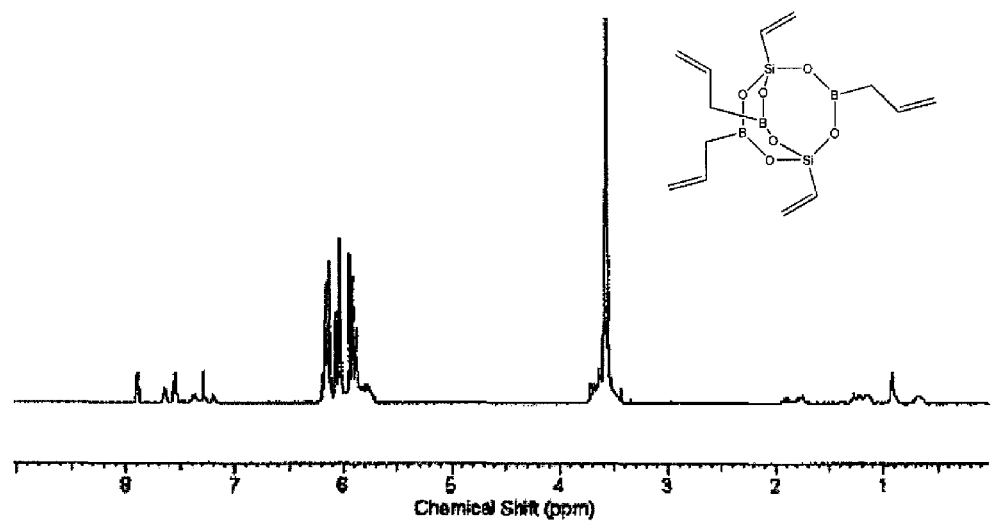
FIG. 2 shows $^1$H-NMR spectrum of one example of Borosilicate-cage-shaped modifier.

Synthesis of the Modifier Containing Boron Containing Groups
(a) Synthesis of m-Carborane Containing Modifier of the Silicones for the Encapsulant of the Present Invention's Semiconductor Devices The synthesis of the m-Carborane containing modifier was carried out by the reaction of 1,7-Bis(chlorotetramethyldisiloxlyl)-m-carborane (DEXSIL 300M from DEXSIL Co.) with 1M Vinyl magnesiumbromide (1.3 eq) in anhydrous THF. After the reaction was completed, excess Grignard reagent was neutralized by addition of Methanol. The mixture was then concentrated and the product was extracted into Ethyl acetate which was washed with 1M HClaq. After drying, the product was purified by column chromatography in Hexanes to obtain the m-Carborane cross-linker and the crude product was distilled at 275° C. to obtain a transparent crosslinker. (85% yield) Concentrated HClaq was used as a TLC stain. FIG. 1 shows $^1$H-NMR spectrum of this m-Carborane containing modifier. The obtained m-Carborane containing modifier had a refractive index n$^{20}_D$ of 1.4873.
(b) Synthesis of Boro-silicate-cage-shaped Modifier Allyl-boric acid was synthesized by the reaction of Trimethylborate and Allylmagnesium bromide (1.3 eq) in Et$_2$O at −78° C. The obtained Allyl-boric acid was washed with water and dilute HClaq to remove the inorganic salts. The Allyl-boric acid was then further reacted with Vinyltrimethoxysilane in refluxing Toluene. On removal of Toluene and Methanol, the Boro-silicate-cage-shaped modifier was obtained as colorless film. FIG. 2 shows $^1$H-NMR spectrum of this Boro-silicate-cage-shaped modifier.

Example 2

Functionalization of Commercially Available Polyorganosiloxane with the Modifier having Boron Containing Groups m-Carborane containing modifier was added to the commercially available silicone resin RTV-615 (Momentive Performance Materials Inc.) as a drop-in-modifier. By changing the amount of m-Carborane containing modifier as well as the amount of RTV-615 Part B (hardener), the physical properties of the resultant colorless transparent poyorganosiloxane resins was found to be tuned very easily. (See Table 1)

TABLE 1

Resin properties depend on the loading amount of m-Carborane containing modifier and RTV-615 hardener.

| Entry | RTV-615 Part A (wt %) | RTV-615 Part B (Hardener) (wt %) | Carborane Modifier (wt %) | Boron content | Curing Condition | Physical Properties |
|---|---|---|---|---|---|---|
| 1 | 90 | 10 | 0 | 0 wt % | 120° C.*1 hr | Tough |
| 2 | 85 | 10 | 5 | 1.2 wt % | 120° C.*1 hr | Very Soft |

TABLE 1-continued

Resin properties depend on the loading amount of m-Carborane containing modifier and RTV-615 hardener.

| Entry | RTV-615 Part A (wt %) | RTV-615 Part B (Hardener) (wt %) | Carborane Modifier (wt %) | Boron content | Curing Codition | Physical Properties |
|---|---|---|---|---|---|---|
| 3 | 81 | 9 | 10 | 2.4 wt % | 120° C.*1 hr | Jelly |
| 4 | 71 | 24 | 5 | 1.2 wt % | 120° C.*1 hr | Tough |
| 5 | 52 | 43 | 5 | 1.2 wt % | 120° C.*1 hr | Hard tough |
| 6 | 50 | 40 | 10 | 2.4 wt % | 120° C.*1 hr | Hard tough |

Also it was found that adding m-Carborane containing modifier makes the surface of the cured resin smoother for some reason.

Figure 3:
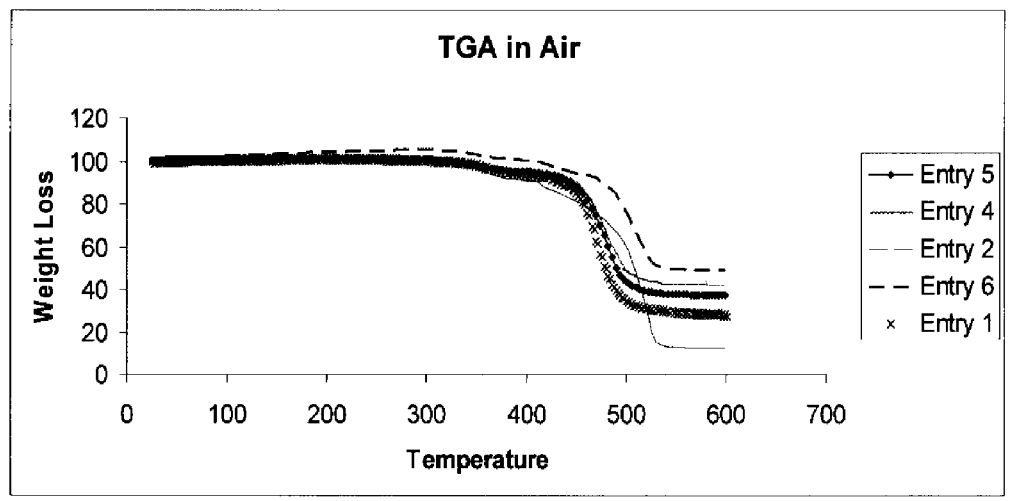
FIG. 3 gives Thermal Gravimetric analysis (TGA) in air of m-Carborane modified RTV-615s.

The TGA study of these resins reveals that m-Carborane modified resins give slightly higher char level which means they have higher thermal durability. (See FIG. 3)

Figure 4:
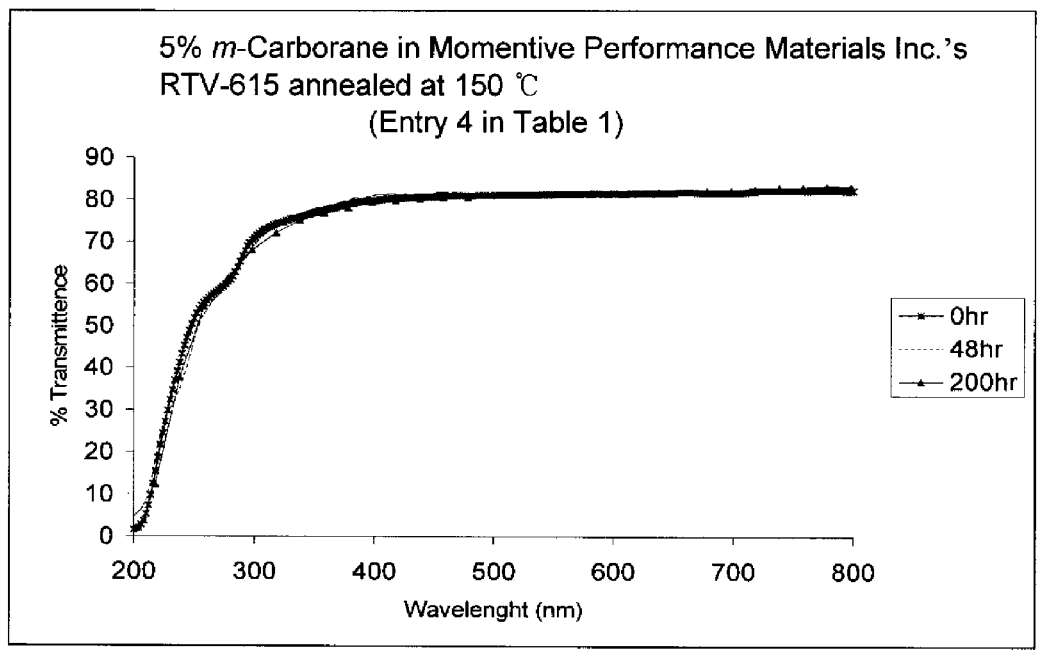
FIG. 4 shows UV-VIS with time studies of 5 wt % m-Carborane modifier loaded RTV-615 isotherm at 150° C.

Also, the UV-VIS spectrum of the sample from Entry 4 in Table 1 reveals that the resin retains its transparency completely even after 150° C.*200 hr thermal durability test. (See FIG. 4)

Example 3

Functionalization of Polyorganosiloxane with the Modifier having Boron Containing Groups Example 3-1

The preparation reactions of the polyorganosiloxane composites invented were carried out by mixing hydrosilyl group containing PDMS (Polydimethylsiloxane) (HMS-064 from Gelest Inc.), vinyl containing T-type PDMS (VTT-106 from Gelest Inc.), and m-Carborane containing modifier in Example 1(a), and catalytic amount of $PtO_2$ in Toluene (50wt % of the total weight) at 80° C. for 1 hr.

The amount of the reagents was adjusted so that the mole amount of total vinyl group and hydrosilyl group became almost the same.

Three materials were synthesized by changing the amount of the Carborane containing modifier which means 10 wt % (boron content: 2.4 wt %), 15 wt % (boron content: 3.5 wt %), and 20 wt % (boron content: 4.7 wt %).

After the reaction, the residual $PtO_2$ was removed by passing over Biotage ISOLUTE® Si-Thiol resin and/or by centrifugal separation (6200 rpm*10 min.).

After removal of Toluene by reducing the pressure, the material was either cast in Teflon dishes or in glass vials and heated to cure. The curing completed in 3 to 4 hours at 150° C. in air.

Instead of $PtO_2$, Karstedt's catalyst diluted by Toluene (final Pt content was 0.4 wt %) could be used as a homogeneous Pt catalyst. In Karstedt's catalyst's case, curing completed within 10 minutes at 150° C.

Figure 5:
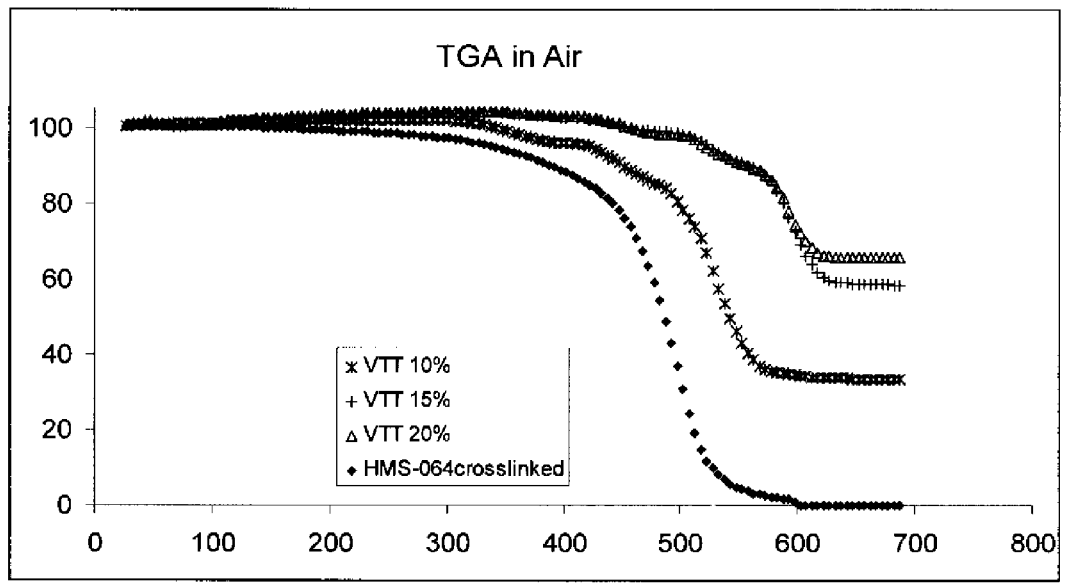
FIG. 5 shows thermal gravimetric analysis of resins of Example 3-1.

The TGA study of these polyorganosiloxanes synthesized in Example 3-1 together with TGA study of m-Carborane containing raw material, DEXSIL 300GC and hydrosilyl group containing raw material HMS-064 revealed that higher m-Carborane contents give higher thermal durabilities. (See FIG. 5)

Figure 6A:
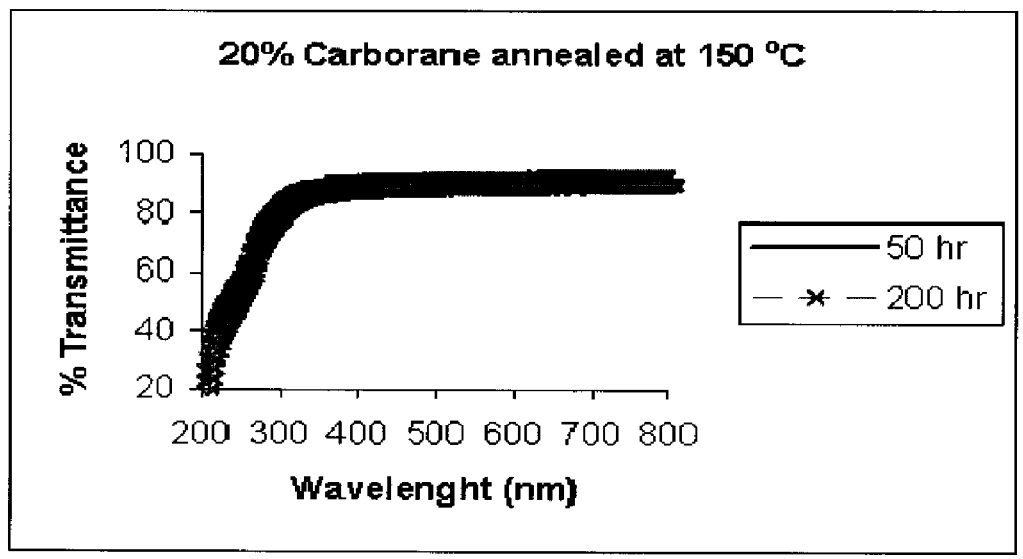
FIG. 6a gives UV-VIS data with m-Carborane modifier loading of 20 wt % annealed at 150° C.
Figure 6B:
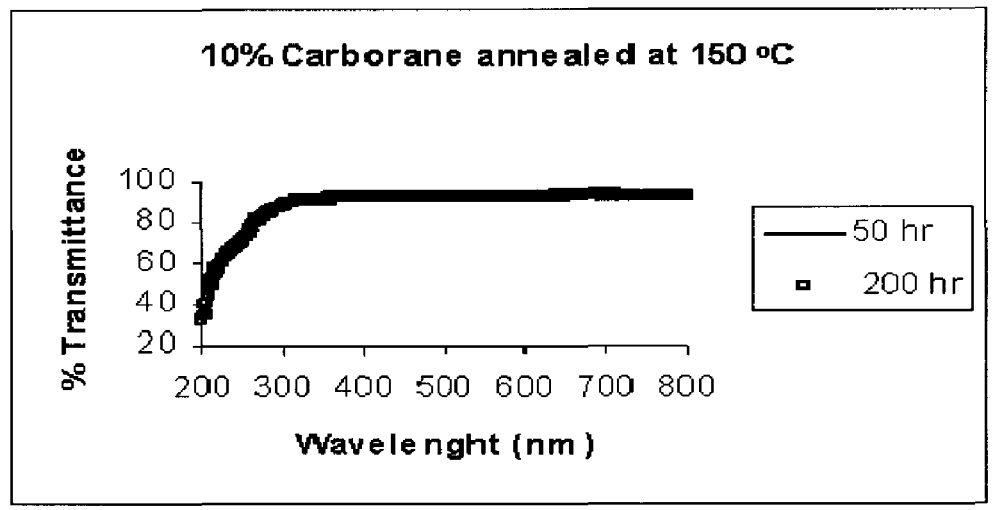
FIG. 6b gives UV-VIS data with m-Carborane modifier loading of 10 wt % annealed at 150° C.

The UV-VIS data for the invented materials (i.e. for example VTT 10% means that the content of m-Carborane was 10 wt % of the total weight of HMS-064, VTT-106, and m-Carborane) showed that there was no change in the spectrum even after annealing for 200 hr at 150° C. (See FIG. 6a and FIG. 6b).

Example 3-2

Another preparation reaction of the polyorganosiloxane composites invented was carried out by mixing hydrosilyl group containing PDMS (KF-9901 from Shin-Etsu Chemical Co.), both end vinyl group terminated linear PDMS (ME-91 from Momentive Performance Materials Inc.), and m-Carborane containing modifier in Example 1(a), and catalytic amount of $PtO_2$ at 80° C. for 1 hr.

Two materials were synthesized with/without the m-Carborane containing modifier. (Entry 7 and 8 in Table 2)

After the reaction, the residual $PtO_2$ was removed by centrifugal separation (6200 rpm*10 min.).

TABLE 2

Polyorganosiloxane resins synthesized with/without the m-Carborane containing modifier.

| Entry | Targeted Si—=/Si—H (Mole Ratio) | KF-9901 (wt %) | ME-91 (wt %) | Carborane Modifier (wt %) | Boron content | Curing Codition | Hardness of the Cured Sample (JIS Type A) | Cured Sample's Refractive Index ($n^{20}_d$) |
|---|---|---|---|---|---|---|---|---|
| 7 | 100/100 | 7 | 83 | 10 | 2.4 wt % | 150° C.*3 hr + 170° C.*2 hr | 17 | 1.4108 |
| 8 | 8/100 | 7 | 93 | 0 | 0 wt % | 150° C.*3 hr + 170° C.*2 hr | 16 | 1.4069 |

Figure 7:
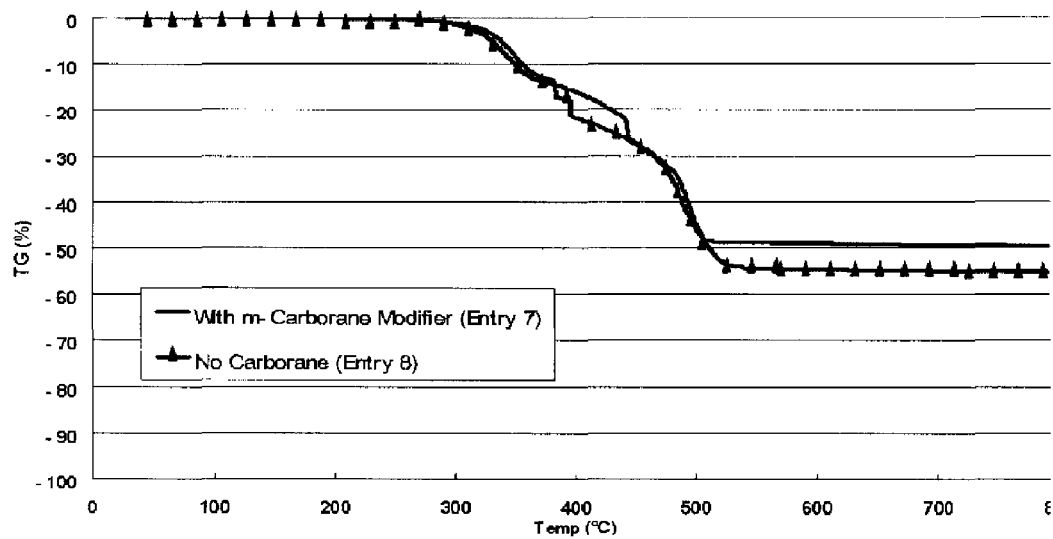
FIG. 7 shows TGA data of resins of Example 3-2 with/without m-Carborane modifier.

The TGA study (10° C./min. in air) of these polyorganosiloxanes synthesized in Example 3-2 revealed that higher carborane contents again gave higher thermal durabilities. FIG. 7 shows TGA data of resins with/without m-Carborane containing modifier.

Example 3-3

Another preferable preparation method of the polyorganosiloxane composite is to mix both end hydroxyl group terminated PDMS with Trimethy borate or Boric acid and heat the mixture at over 100° C. for 1 hr.

0.5 g of Trimethoxyvinylsilane, 0.5 g of Trimetyl borate, and 1.5 g of both end hydroxyl group terminated PDMS (Gelest Inc.'s DMS-S12) were mixed and heated up to 150° C. for 1 hr (The boron content: 2.1 wt %). The resultant resin was a little bit hazy soft elastomer.

1.0 g of Trimethoxyvinylsilane, 1.0 g of Trimetyl borate, and 1.5 g of both end hydroxyl group terminated PDMS (Gelest Inc.'s DMS-S12) were mixed and heated up to 150° C. for 1 hr (The boron content: 3.0 wt %). The resultant resin was slightly hazy soft elastomer.

Example 4

Preparation of Polyorganosiloxane Composites with Boron Containing Materials as well as Zirconium Containing Materials Polyorganosiloxane composites were prepared by using condensation reactions of hydroxysilyl groups and alkoxysilyl group in the presence of boron containing materials and zirconium containing materials.

The zirconium containing materials served as a catalyst of the reaction as well as a reagent.

1.0 g of Trimethoxyvinylsilane, 1.0 g of Trimetyl borate, 1.5 g of both end hydroxyl group terminated PDMS (Gelest Inc.'s DMS-S12), and zirconium containing materials were mixed and heated up to 150° C. for 1 hr. (Entry 11 is without zirconium.)

copolymer (Gelest Inc.'s PSIAL-007), and 0.4 g of Aluminum zirconium double metal alkoxide (Gelest Inc.'s DALZR50, 0.67M). Reaction mixture was stirred in an oil bath at 65° C. for 1.5 hr and placed in a vacuum oven at 40° C. for 24 hr, at which point it still remained a transparent liquid. The liquid was cast in a Teflon dish and placed in an oven at 150° C., where it cured after 3.5 hr and was found to have 15% loss of weight, and after the curing, there observed negligible weight loss even after 48 hour annealing at 150° C.

Example 6

Synthesis of Zirconium-containing Polysiloxane using Zirconium n-Butoxide

Figure 18:
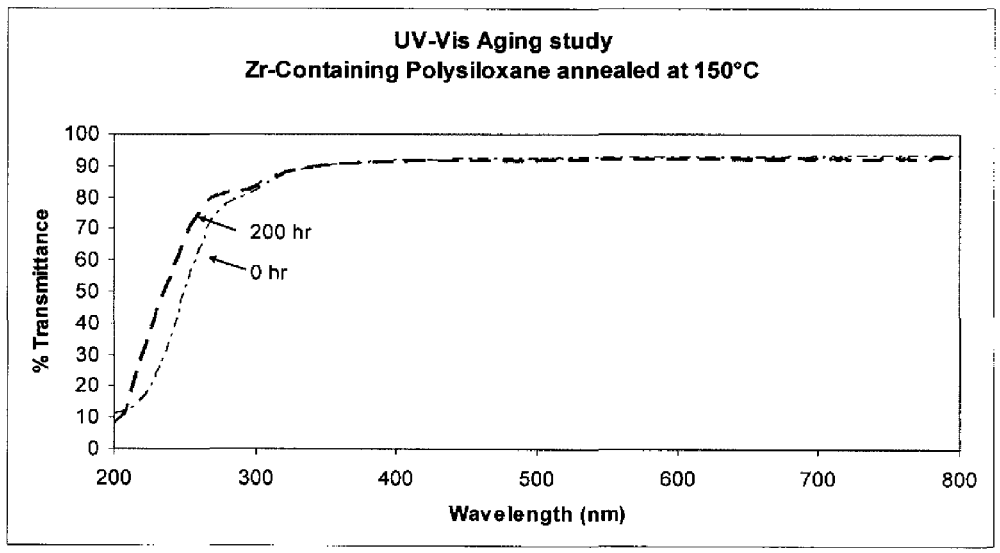
FIG. 18 shows a UV-Vis spectra of the sample prepared in Example 6 before and after thermal stability test at 150° C. for 200 hours.

Same synthetic method as Example 5 above but replacing 0.4 g of Aluminum zirconium double metal alkoxide with 0.2 g of Zirconium n-butoxide. See FIG. 18 for the UV-Vis spectra of the cured product of this reaction.

Figure 23:
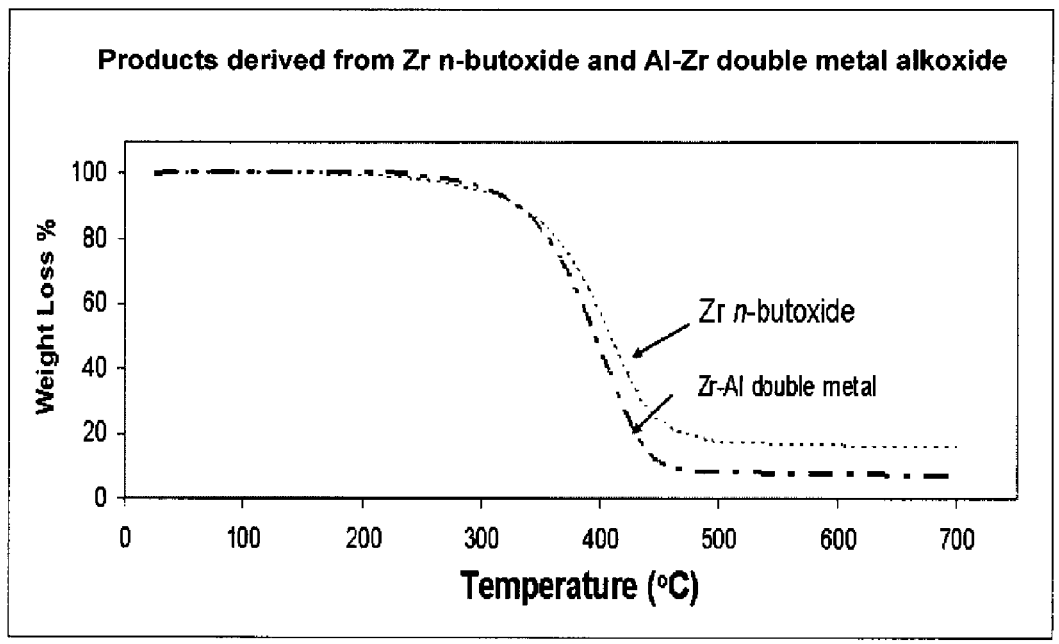
FIG. 23 shows the TGA data of the samples prepared in Examples 5 and 6 showing those materials stable up to 350° C.

The thermogravamatric analysis (TGA) data also revealed heat stability of the samples obtained in Example 5 and 6 up to 350° C. (FIG. 23)

Example 7

Synthesis of Siloxane Aluminate

To a 20 mL scintillation vial with a stir bar was added silonal terminated poly(dimethylsiloxane) (Gelest Inc.'s DMS-S12, DMS-S15, or DMS-S33) and Vinyltrimethoxysilane (Gelest Inc.'s SIV9250.0) in Toluene (50 wt %). The reaction mixture was stirred uncovered in an oil bath at 70° C. for 1 hr at which point Diethoxysiloxane-s-butylaluminate copolymer (Gelest Inc.'s PSIAL-007) was added and stirred overnight at room temperature. Solvents were removed under reduced pressure and placed in a vacuum oven at 40° C. for 1 hr at which point it still remained a transparent liquid. The liquid was then placed in an oven at 150° C., where it cured overnight.

TABLE 3

Polyorganosiloxane composites prepared with boron containing material (Trimethyl borate) with/without zirconium containing materials.

| Entry | Trimethoxy-vinylsilane (wt %) | DMS-S12 (wt %) | Trimethyl borate (wt %) | Zr(acac)$_4$ (wt %) | Zr(n-BuO)$_4$ (wt %) | Total content of boron and zirconium | Curing Codition | Physical Properties |
|---|---|---|---|---|---|---|---|---|
| 9 | 28 | 41 | 28 | 3 | — | 3.4 wt % | 150° C.*1 hr | Transparent elastomer |
| 10 | 28 | 41 | 28 | — | 3 | 3.7 wt % | 150° C.*1 hr | Slightly hazy elastomer |
| 11 (Example 3-3) | 29 | 42 | 29 | — | — | 3.0 wt % | 150° C.*1 hr | Hazy soft elastomer |

Figure 8:
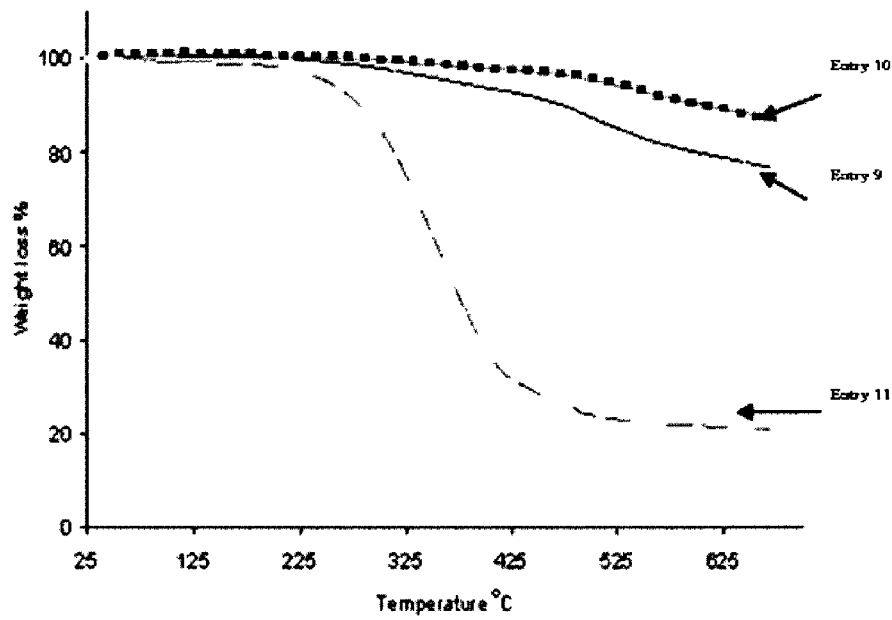
FIG. 8 shows TGA data of the polyorganosiloxane composites prepared in Example 4.

The TGA study of the polyorganosiloxane composites prepared in Example 4 revealed that higher boron and zirconium contents gave higher thermal durabilities. (FIG. 8)

Example 5

Figure 19:
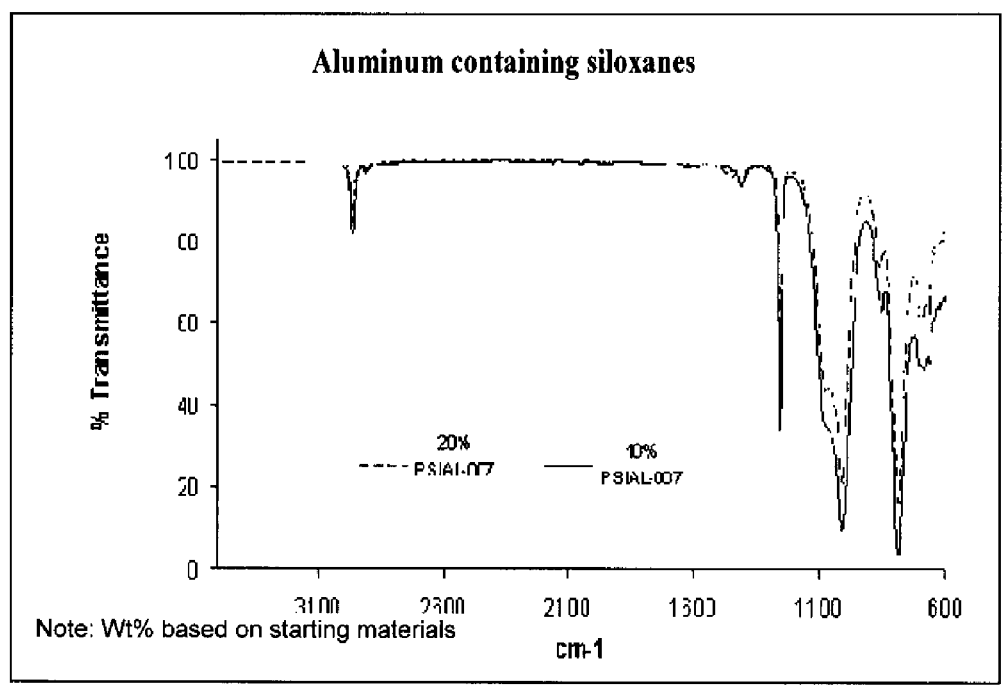
FIG. 19 shows a FTIR spectra of the sample prepared in Example 7 after completion of the reaction and NO OH peaks were observed.

Synthesis of Zirconium-Containing Polysiloxane using Aluminum Zirconium Double Metal Alkoxide To a 20 mL scintillation vial with a stir bar was added 4 g of silanol terminated poly(dimethylsiloxane) (Gelest Inc.'s DMS-S12), 0.4 g of Diethoxysiloxane-s-butylaluminate The FTIR spectrum shows the completed reaction and NO OH peaks were between 3200 and 3550 cm$^{-1}$ observed (FIG. 19)

Figure 20:
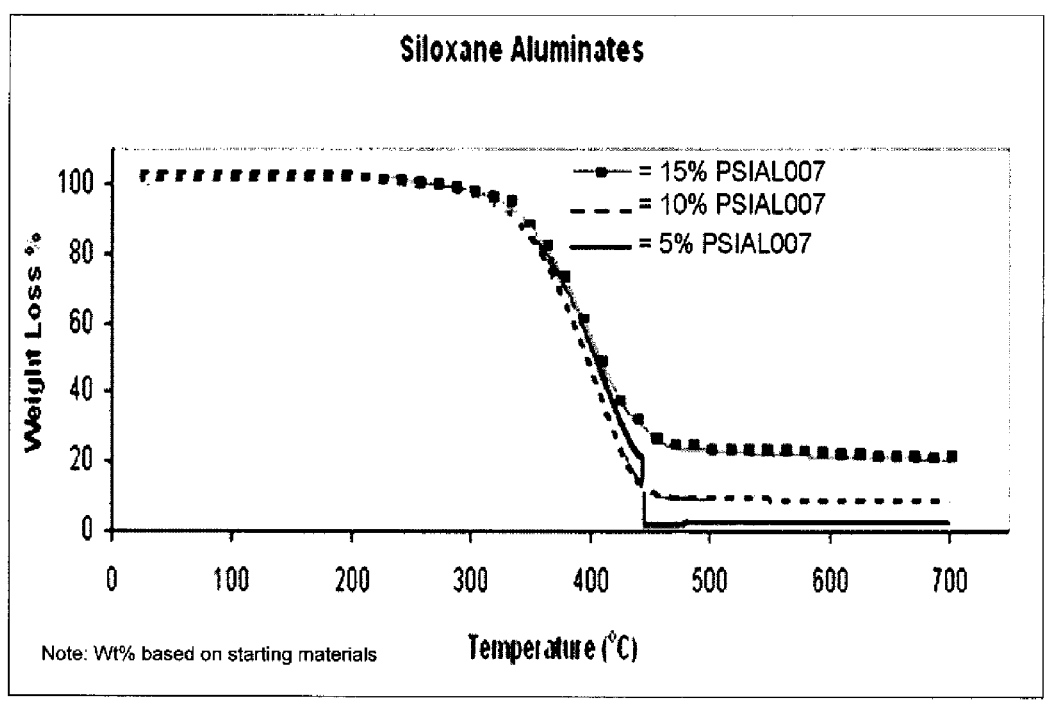
FIG. 20 shows high thermal stability up to 350° C. of the siloxane aluminate samples prepared in Example 7.

The siloxane aluminate shows its high thermal stability up to 350° C. (FIG. 20)

Example 8

Synthesis of Boron and Zirconium Containg Siloxane Aluminate

To a 20 mL scintillation vial with a stir bar was added silonal terminated poly(dimethylsiloxane) (Gelest Inc.'s DMS-S12) and Aluminum zirconium double metal alkoxide (Gelest Inc.'s DALZR50, 0.67M) or Zirconium n-butoxide (Gelest Inc.'s AKZ945). The reaction mixture was stirred for 1 minute, after which Trimethyl borate and Diethoxysiloxane-s-butylaluminate copolymer (Gelest Inc.'s PSIAL-007) were added. Then the reaction mixture was stirred in an oil bath at 65° C. for 1.5 hr and placed in a vacuum oven at 40° C. for 24 hr, at which point it had already cured. The cured material was further placed in an oven at 150° C. overnight.

Figure 21:
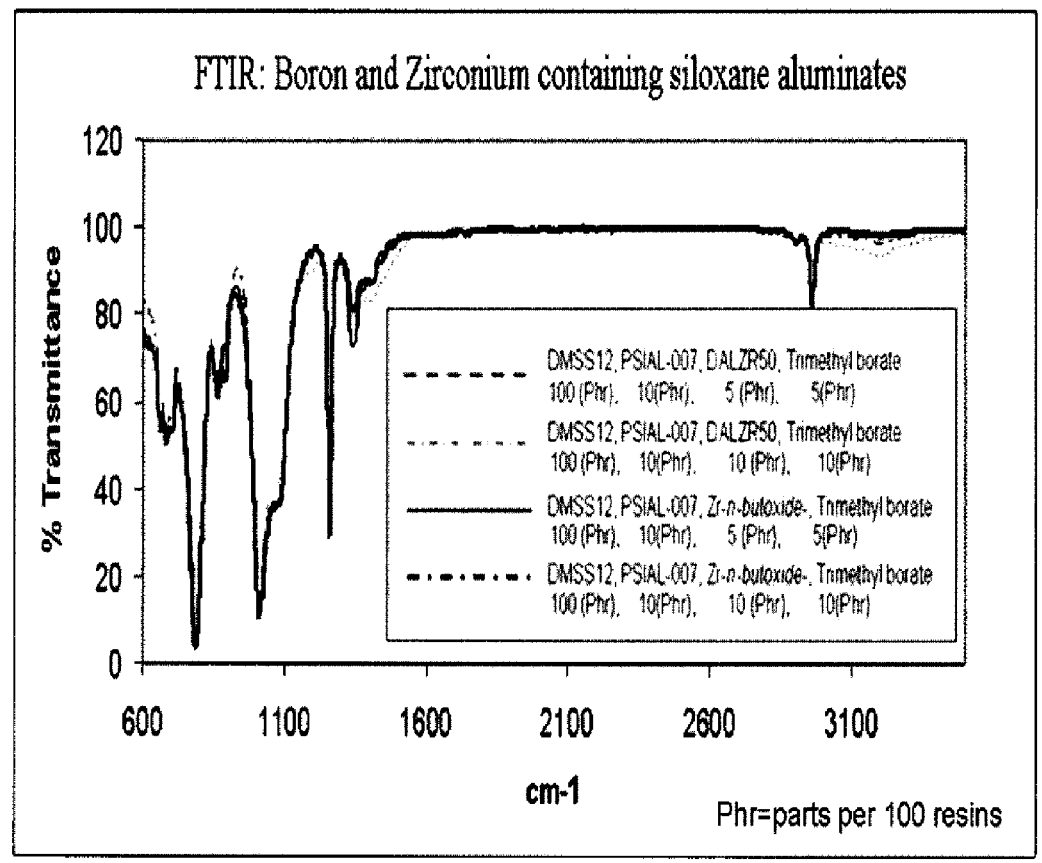
FIG. 21 shows FTIR graphs of the composites obtained in Example 8.

Overlaid FTIR spectra in FIG. 21 are those of the samples prepared in this Experiment 8 containing Gelest Inc.'s DMS-S12, Diethoxysiloxane-s-butylaluminate copolymer (Gelest Inc.'s PSIAL-007), Al/Zr double metal alkoxide, Zirconium n-butoxide, and Trimethylborate in different concentrations. It was found that Al/Zr double metal alkoxide reaction (DALZR50) goes to completion when compared to Zirconium n-butoxide since in the former case, a very small or no OH peak was detected between 3200 and 3550 $cm^{-1}$.

Figure 22:
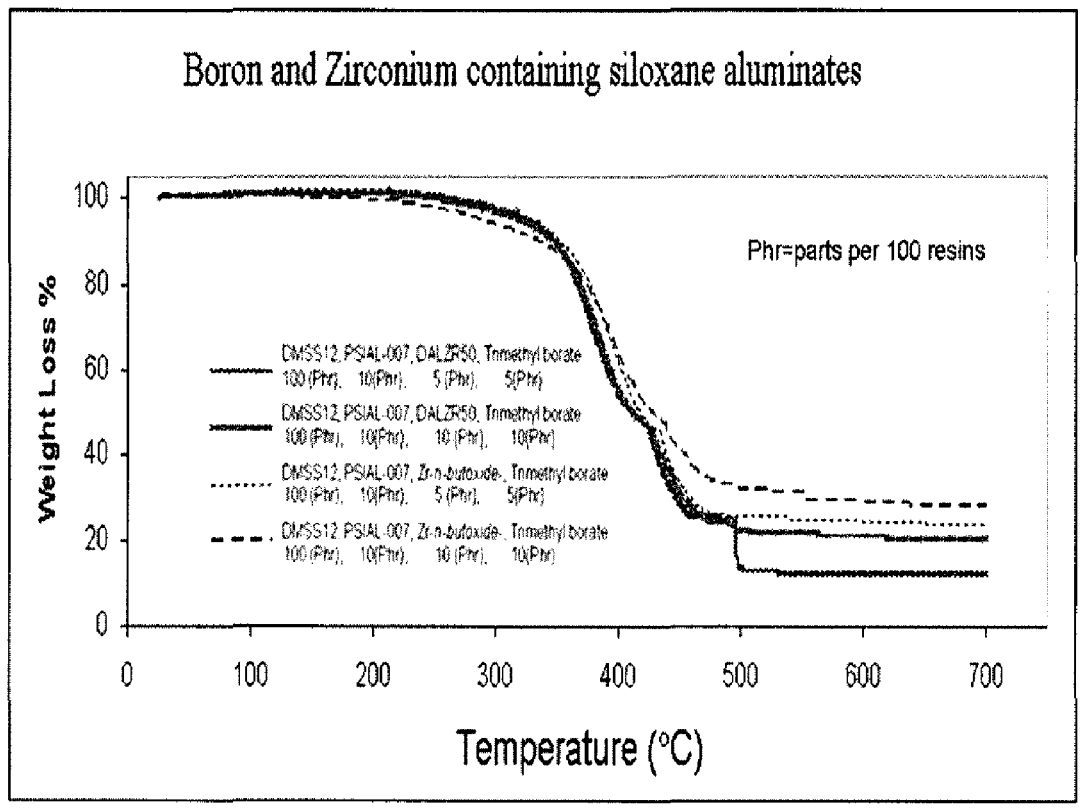
FIG. 22 shows thermogravamatric analysis (TGA) data of the mixed boron, zirconium siloxane aluminate materials obtained in Example 8 and all of them are found to be stable up to 350° C.

The TGA data show all the mixed boron, zirconium siloxane aluminate materials obtained in Example 8 are stable up to 350° C. (FIG. 22).

Evaluation Examples

Figure 9:
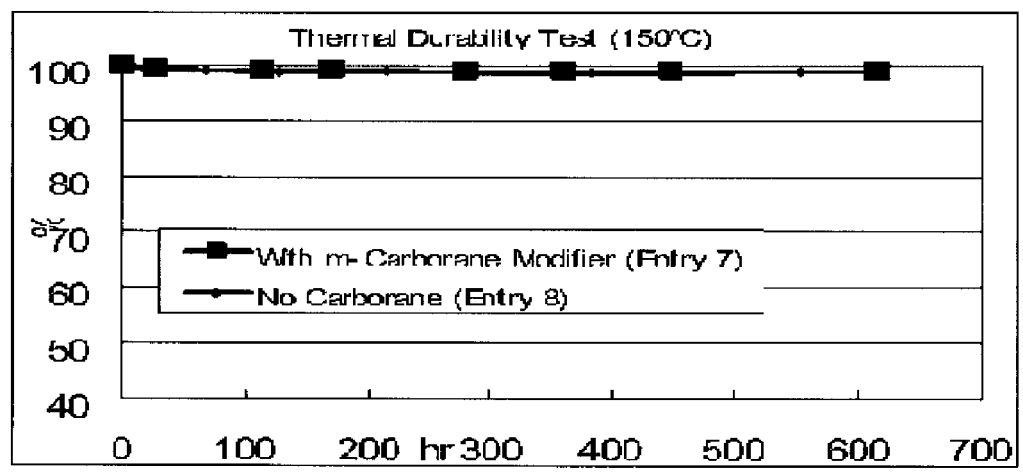
FIG. 9 shows thermal durability test (150° C.) results of resins of Example 3-2 with/without m-Carborane modifier.
Figure 10:
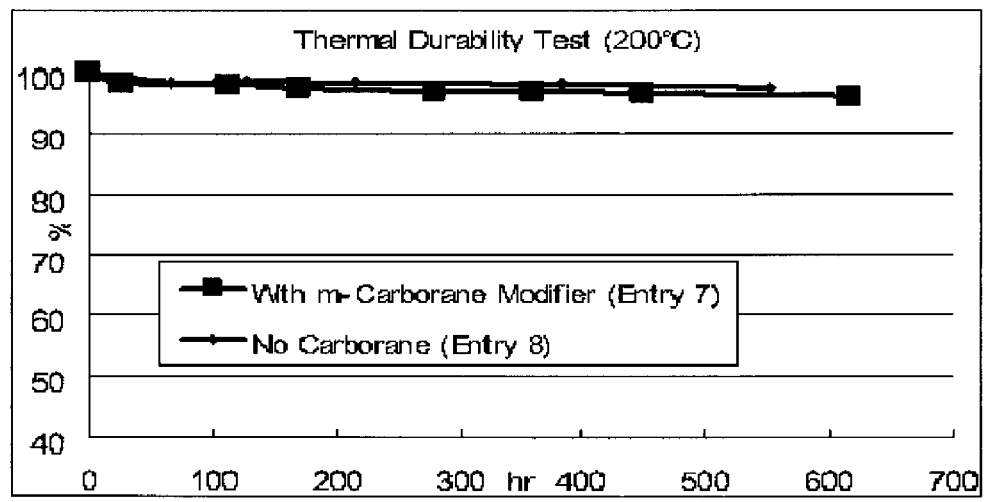
FIG. 10 shows thermal durability test (200° C.) results of resins of Example 3-2 with/without m-Carborane modifier.
Figure 11:
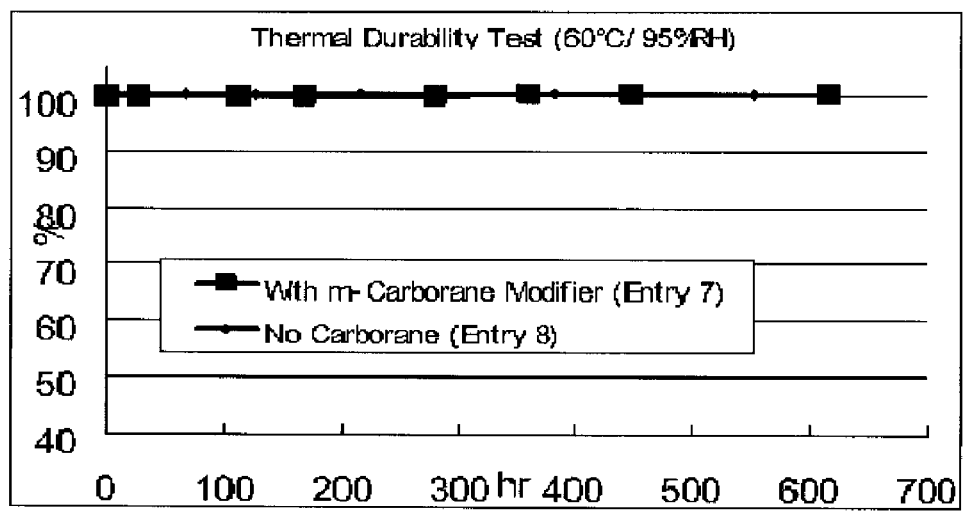
FIG. 11 shows hydrothermal durability test (60° C./95% RH) results of resins of Example 3-2 with/without m-Carborane modifier.

Performances of the Polyorganosiloxane Composites Obtained in the Example 3-2 were Evaluated (Hydro)Thermal Durability Test Hydrothermal durability tests of the resins were conducted at 150° C., 200° C., and 60° C./95% RH, respectively. (FIGS. 9-11 and Table 2). FIG. 9 shows thermal durability test (150° C.) of resins with/without m-Carborane containing modifier. FIG. 10 shows thermal durability test (200° C.) of resins with/without m-Carborane containing modifier. FIG. 11 shows hydrothermal durability test (60° C./95% RH) of resins with/without m-Carborane containing modifier. From these durability tests, m-Carborane containing modifier was found to give no disadvantage in terms of (hydro)thermal durability of the resins themselves.

UV Durability Test

Figure 12:
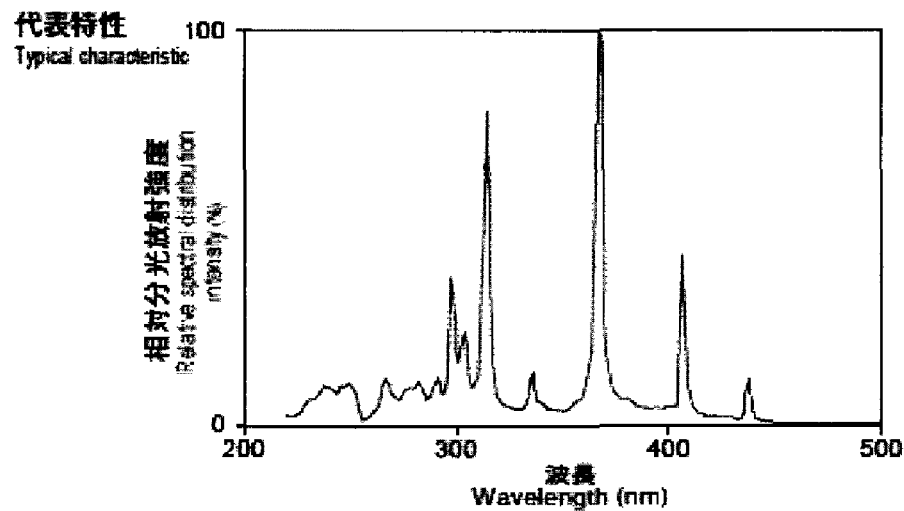
FIG. 12 gives the spectrum of the original UV light source for the UV durability tests of resins. (Under 350 nm was cut off.)

UV durability tests were conducted by irradiating UV light of 2100 $mW/cm^2$ for 20 hours. (The spectrum of the original UV light source is shown in FIG. 12. The light below 350 nm was cut off using light-cut-filter.)

Both resins from Entry 7 and 8 (see Table 2) showed no coloration or crack which means these polyorganosiloxanes are highly UV durable.

Moisture-Reflow Test

Moisture-Reflow test was conducted using LED packages with Ag surface, Ceramic surface, and Polyphthalamide (PPA) surface, respectively.

The resins from Entry 7 and 8 (see Table 2), and those resins blended with Thixotropic agent (fumed silica) were potted into the each LED package and cured by using the heat condition of 150° C.*3 hr+170° C.*2 hr.

Potted LED packages were kept under 60° C./90% RH for 24 hours and then heated on a reflow pan (260° C.) for 5 minutes.

Surprisingly enough, regardless of the presence of the Thixotropic agent, the resin with m-Carborane (Entry 7) gave much better adhesiveness toward PPA surface than the resin without m-Carborane (Entry 8). And Entry 7 resin showed no delamination from the PPA surface.

In cases of Ag and Ceramic LED packages, resins from Entry 7 and 8 gave the same results and none of the resins were delaminated during the Moisture-Reflow test.

Heat-Cycle Test

Heat-Cycle tests were performed using LED packages with Ag surface, Ceramic surface, and Polyphthalamide (PPA) surface as were used in the Moisture-Reflow test.

Figure 13:
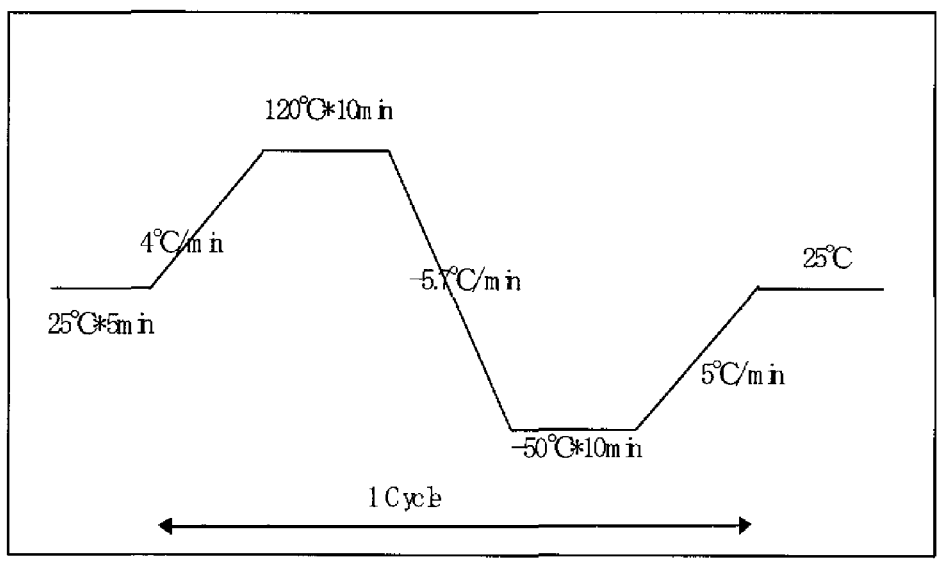
FIG. 13 gives the heating-cooling profile of the Heat-Cycle tests of the resins.

Regardless of the presence of the Thixotropic agent, both of the resins from Entry 7 and 8 gave no delamination up to 300 cycles. (The heating-cooling profile is depicted in FIG. 13.).

Examples of the Composites' Application to the Actual Semiconductor (LED) Devices Performances as LED Encapsulants of the Polyorganosiloxane Composites obtained in the Examples above were Evaluated.

LED Life Test

LED Life tests were conducted using LED packages with Ag surface. Life test conditions were 25° C./55% RH and 60° C./90% RH.

Figure 14:
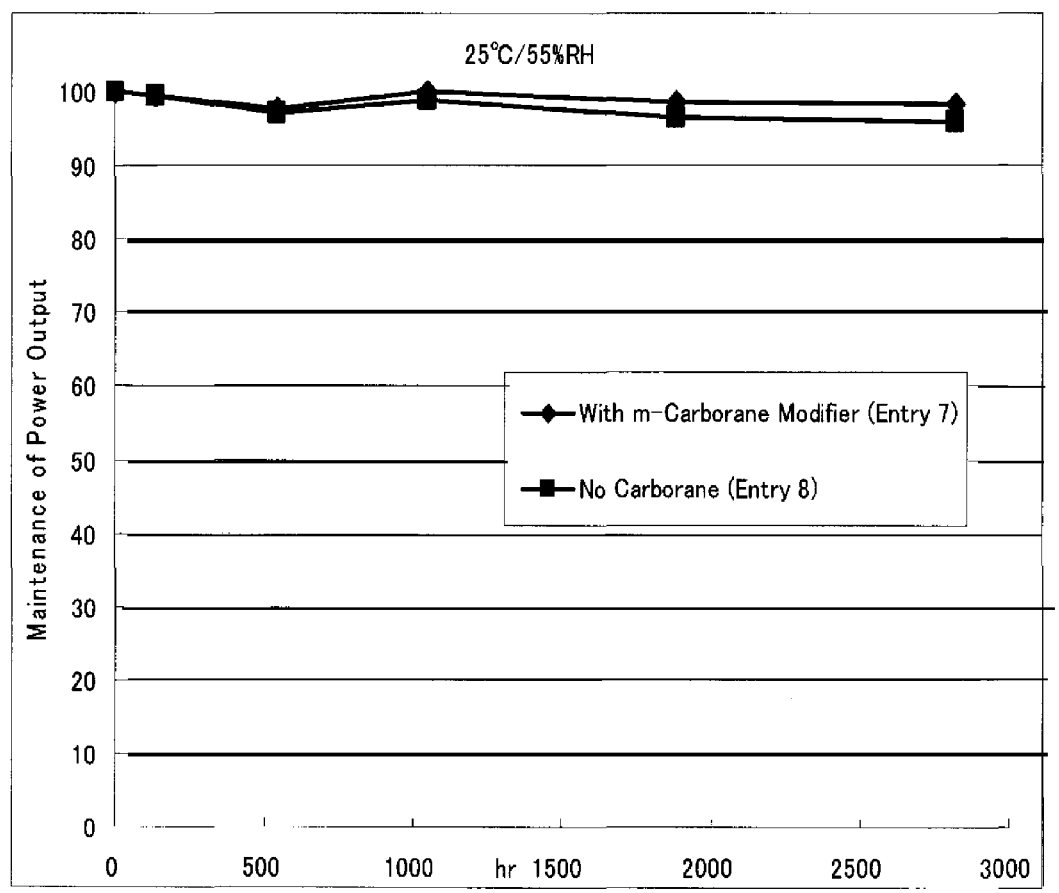
FIG. 14 shows power output maintenance factor of LEDs using resins of Example 3-2 without phosphors (25° C./55% RH).
Figure 15:
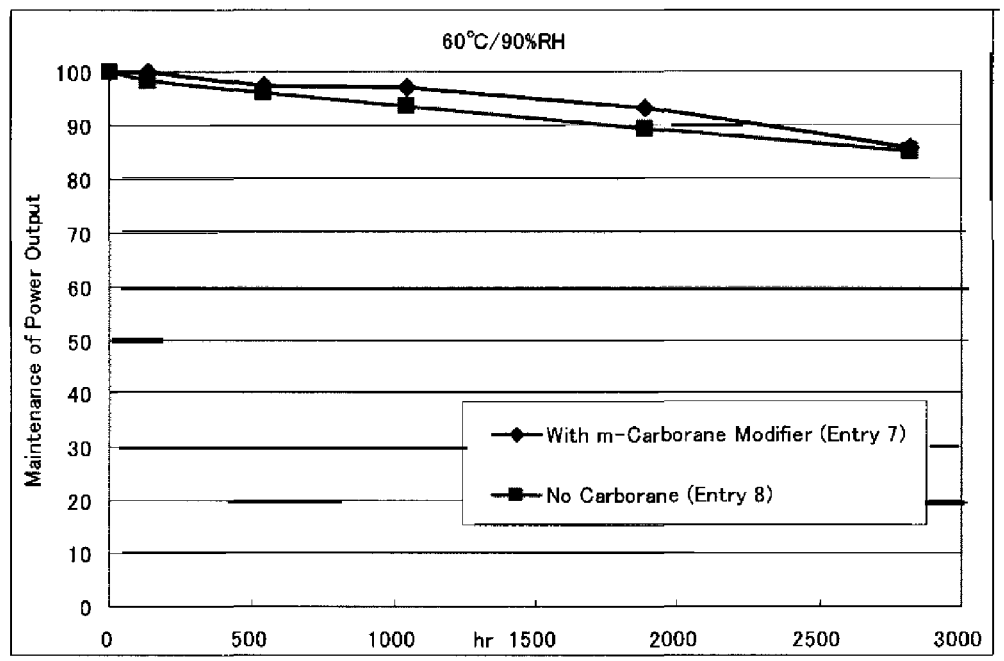
FIG. 15 shows power output maintenance factor of LEDs using resins of Example 3-2 without phosphors (60° C./90% RH).
Figure 16:
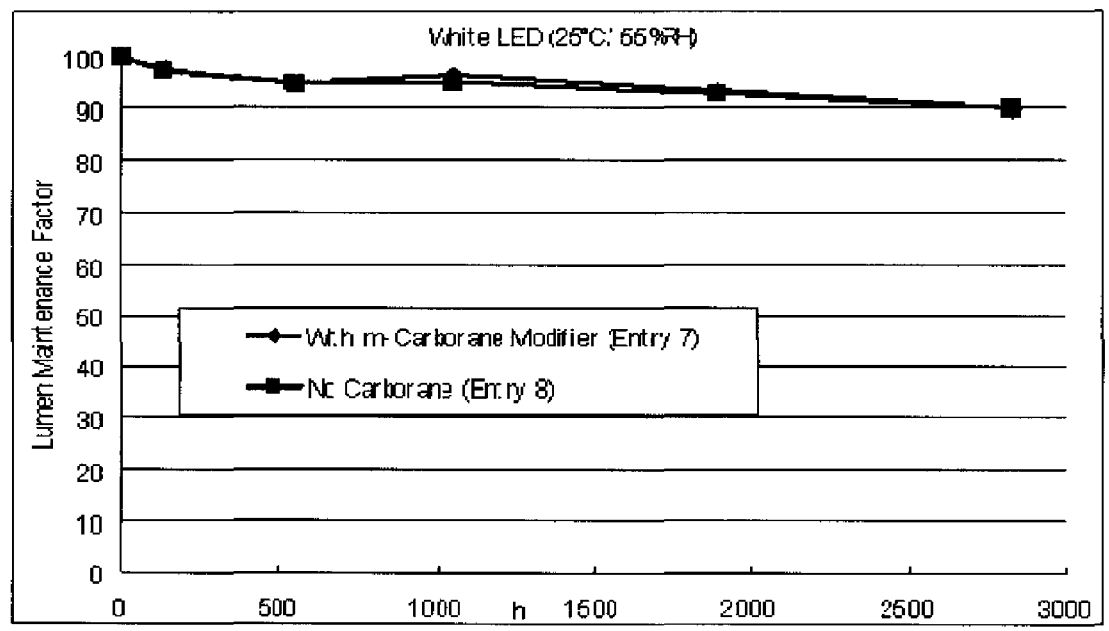
FIG. 16 shows lumen maintenance factor of LEDs using resins of Example 3-2 with RGB-phosphors (25° C./55% RH).
Figure 17:
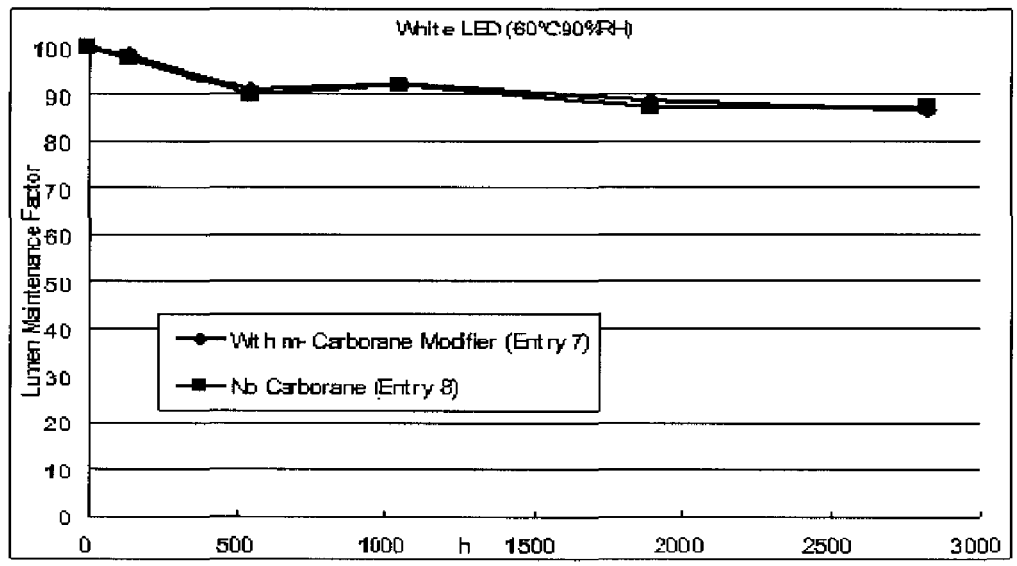
FIG. 17 shows lumen maintenance factor of LEDs using resins of Example 3-2 with RGB-phosphors (60° C./90% RH).

FIGS. 14 and 15 show the power output maintenance factors of the LEDs potted with only resins without phosphors. And FIGS. 16 and 17 show the lumen maintenance factors of the LEDs potted with resins dispersed with RGB phosphors. More specifically, FIG. 14 shows the power output maintenance factor of LEDs without phosphors (25° C./55% RH). And, FIG. 15 shows the power output maintenance factor of LEDs without phosphors (60° C./90% RH). More specifically, FIG. 16 shows the lumen maintenance factor of LEDs with RGB-phosphors (25° C./55% RH). And FIG. 17 shows the lumen maintenance factor of LEDs with RGB-phosphors (60° C./90% RH).

The present application has been described using specific aspects of the invention. Additional descriptions of semiconductor light emitting devices, and LEDs in particular, as well as manufacturing methods therefore, and industrial applicability can be found in detail in European Patent No. WO2006090804 published Aug. 31, 2006, and also published as EP1854831 (A1), the specification of which is hereby incorporated herein in its entirety.

Although the present invention has been described in connection with the preferred embodiments, it is to be understood that modifications and variations may be utilized without departing from the principles and scope of the invention, as those skilled in the art will readily understand. Accordingly, such modifications may be practiced within the scope of the following claims.

REFERENCES

1. US Patent Application Publication No. 2004/0063840
2. WIPO Publication No. WO2005/085303
3. Japanese Patent Document: JP-A-2002-203989
4. Japanese Patent Document: JP-A-2004-356506
5. U.S. Pat. No. 5,648,687
6. WIPO Publication No. WO2006/055456
7. U.S. Pat. No. 7,160,972
8. U.S. Pat. No. 6,204,523
9. U.S. Pat. No. 6,590,235
10. U.S. patent application Ser. No. 12/072891
11. U.S. patent application Ser. No. 12/072853
12. Japanese Patent Document: JP-Hei 5-25300
13. Hyomen Kagaku, Vol. 18 No. 9, pp 21-26

14. Hyomen Kagaku, Vol. 19 No. 2, pp 44-51
15. WIPO Publication No. WO2008/018981 A2
16. Journal of Polymer Science; Part A: Polymer Chemistry, 2006, 44, 147.
17. Journal of Polymer Science; Part A: Polymer Chemistry, 1998, 36, 1969.

The invention claimed is:

1. A semiconductor device comprising a curable encapsulating cross-linked polyorganosiloxane composite, wherein the composite is produced by the process comprising reacting a hydrosilyl-containing compound A with compound 1A, wherein A and 1A are:

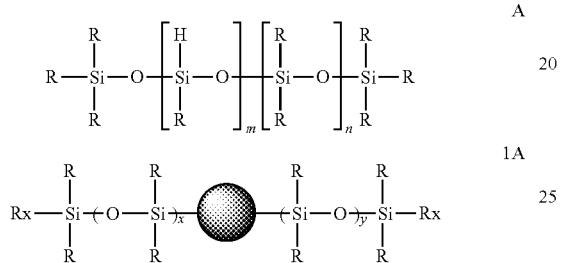

wherein for A, each R independently represents a group selected from hydride, alkyl, alkenyl, aryl, silyl, and condensable group, and 'm' and 'n' each are an integer of 1 or more; and at least one hydride group is included in the molecule A for the hydrosilylation to occur with 1A; and for compound 1A, each R independently represents a group selected from hydride, alkyl, alkenyl, aryl, siloxyl; Rx represents an alkenyl or alkynyl group on the molecules; and the sphere represents Carborane ($B_{10}H_{10}C_2$) and 'x' and 'y' each are an integer of 0 or more.

2. A semiconductor device in claim 1 wherein for 1A, Rx is vinyl, Carborane is meta-Carborane, and both 'x' and 'y' are 1.

3. The semiconductor device of claim 1, wherein the Carborane ($B_{10}H_{10}C_2$) is ortho-Carborane.

4. The semiconductor device of claim 1, wherein the Carborane ($B_{10}H_{10}C_2$) is meta-Carborane.

5. The semiconductor device of claim 1, wherein the Carborane ($B_{10}H_{10}C_2$) is para-Carborane.

6. A semiconductor device comprising a curable encapsulating cross-linked polyorganosiloxane composite, where the composite is made by the process comprising reacting a hydrosilyl-containing compound A with compound 2A or 2A' under conditions sufficient to produce said composite, where said compounds A and 2A and 2A'are represented by the following general formulae:

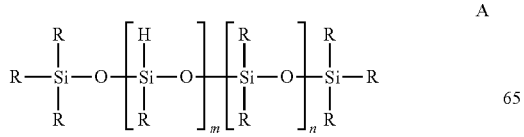

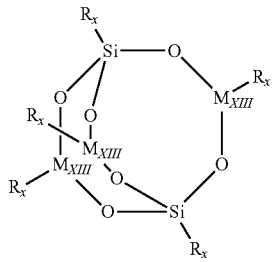

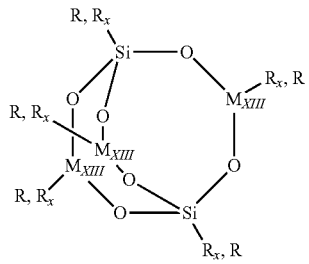

wherein for A, each R independently represents a group selected from hydride, alkyl, alkenyl, aryl, silyl, and condensable group which is either alkoxyl or hydroxyl, and 'm' and 'n' each are an integer 1 or more; and at least one hydride group is included in the molecule A for the hydrosilation to occur with 2A or 2A';

wherein for compound 2A', the notation 'R, Rx' indicates that there is either one R or Rx at the appropriate locations on 2A'; and there must be at least one Rx on 2A', and the remaining 'R, Rx' positions are either R or Rx;

wherein for 2A and 2A', R each independently represents a group selected from hydride, alkyl, alkenyl, aryl, siloxyl; Rx represents an alkenyl or alkynyl group on the molecules; $M_{XIII}$ represent any group 13 element of the periodic table; where the three $M_{XIII}$ positions on 2A and 2A' have the same group 13 element; and wherein there is at least 0.1 wt % of the 13th group element in cross-linked polyorganosiloxane composite.

7. A semiconductor device of claim 6, wherein for A, R is an alkyl selected from the group consisting of methyl, ethyl, propyl and trifluoropropyl, or vinyl.

8. A semiconductor device comprising a curable encapsulating cross-linked polyorganosiloxane composite of the following compound:

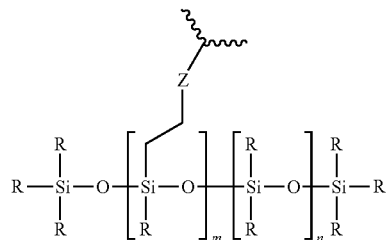

wherein Z can represent either 2A or 2A' after a hydrosilation reaction, where 2A and 2A' are the following:

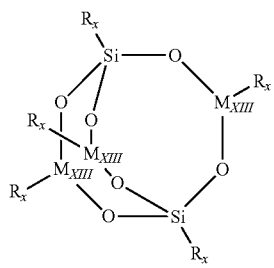

2A

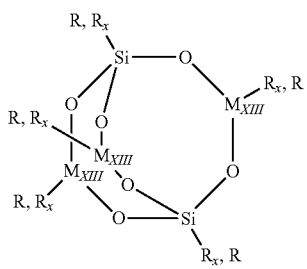

2A' wherein for 2A and 2A', each R independently represents a group selected from hydride, alkyl, alkenyl, aryl, siloxyl; Rx represents an alkenyl or alkynyl group on the molecules; where the three $M_{XIII}$ positions on 2A and 2A' have the same group 13 element; and wherein there is at least 0.1 wt % of the 13th group elements in cross-linked polyorganosiloxane composite;

wherein for compound 2A', the notation 'R, Rx' indicates that there is either an R or Rx at the appropriate locations on 2A'; and there must be at least one Rx on 2A', and the remaining 'R, Rx' positions are either R or Rx.

9. A semiconductor device of claim 1, 2, 6, 7, or 8 where a noble metal oxide is used as a catalyst of the composite's synthesis.

10. A semiconductor device comprising a curable encapsulating cross-linked polyorganosiloxane composite wherein the composite is produced by the condensation process comprising:

reacting a compound selected from the group consisting of A″, B, and C; with a compound selected from the group consisting of A″, B, C, D2, E2, F2, H, I, K, L and M, where A″, B, C, D2, E2, F2, H, I, K, L and M are:

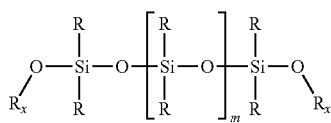

A″

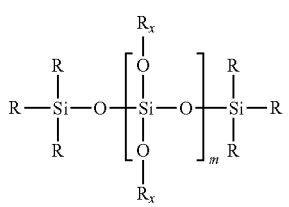

B

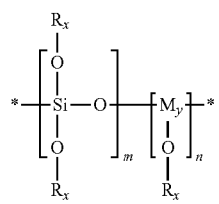

C

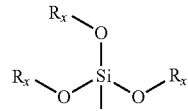

D2

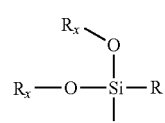

E2

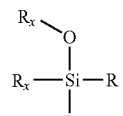

F2

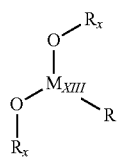

H

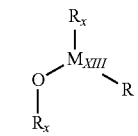

I

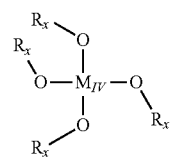

K

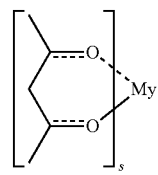

L

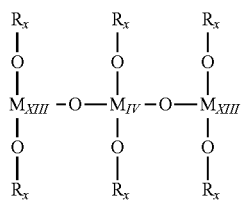

M

My in structure C, and L represents a group 4 or 13 element of the periodic table and 's' in L is 3 when My is a 13th group element, and 4 when My is a 4th group element; and 'm' and 'n' represents an integer of 1 or more; and where structures A″, B, and C are either hydroxyl or alkoxyl containing compounds; wherein each R independently represent a group selected from hydride, alkyl, alkenyl, aryl, and siloxyl groups (at least one R is alkyl, alkenyl, or aryl); O—Rx represents condensable hydroxyl, alkoxyl groups; $M_{XIII}$ in H, I and M represents any group 13 element of the periodic table; $M_{IV}$ in M represents any group 4 element of the periodic table; for M, the two $M_{XIII}$ positions have the same group 13 element; and where there is at least 0.1 wt % of the 4th or 13th group element or a combination of elements in cross-linked polyorganosiloxane composite.

11. A semiconductor device of claim 10, wherein A" is reacted with A"; or B is reacted with B; and further comprising the addition of a reagent containing one or more elements of a chemical from group 4 and/or 13 of the periodic table.

12. A semiconductor device of claim 10, wherein A" or B is reacted with either D2, E2, or F2; and further comprising the addition of a reagent containing one or more elements of a chemical from group 4 and/or 13 of the periodic table.

13. A semiconductor device comprising a curable cross-linked polyorganosiloxane composite selected from a group consisting of:

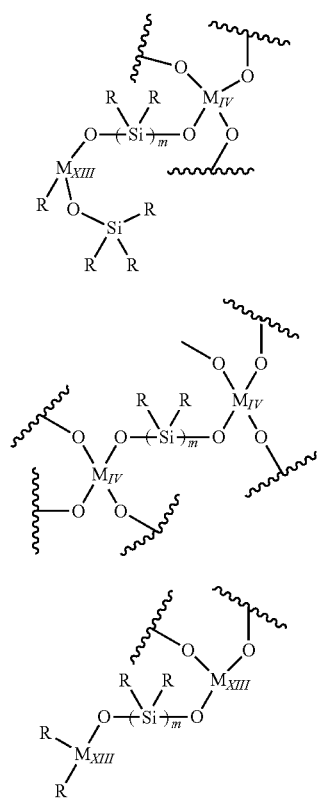

wherein, each R independently represents a group selected from hydride, alkyl alkenyl, aryl, hydroxyl, and siloxyl groups (at least one R is alkyl, alkenyl, or aryl); each Rx independently represents alkenyl, alkynyl, hydroxyl or alkoxyl; $M_{XIII}$ represents any group 13 element of the periodic table; $M_{IV}$ represents any group 4 element of the periodic table; wherein for P, the two $M_{IV}$ positions having different $M_{IV}$ elements or having the same $M_{IV}$ element; wherein for Q and R, the two $M_{XIII}$ having different $M_{XIII}$ elements or having the same $M_{XIII}$ element; and 'm' is an integer of 1 or more.

14. A semiconductor device of claim 1, 2, 6, 7, 8, 10, 11, 12, or 13 wherein the composite is cured at a temperature less than 180 degree C.

15. A semiconductor device of claim 1, 2, 6, 7, 8, 10, 11, 12, or 13 whereby the cross-linked polyorganosiloxane composites produced are catalyst-free.

16. A semiconductor device of claim 1, 2, 6, 7, 8, 10, 11, 12, or 13 wherein at least one compound of the each compound sets, A, 2A, or 2A'; and A or 1A; and A", B, C, D2, E2, F2, H, I, K, or M has an average molecular weight of 3,000 or more.

17. A semiconductor device of claim 1, 2, 6, 7, 8, 10, 11, 12, or 13 wherein the semiconductor device is a LED or a photovoltaic device.

18. A method of making a curable encapsulating cross-linked polyorganosiloxane composite, comprising reacting a hydrosilyl-containing compound A with compound 2A or 2A' under conditions sufficient to produce said composite, where said compounds A and 2A and 2A' are represented by the following general formulae:

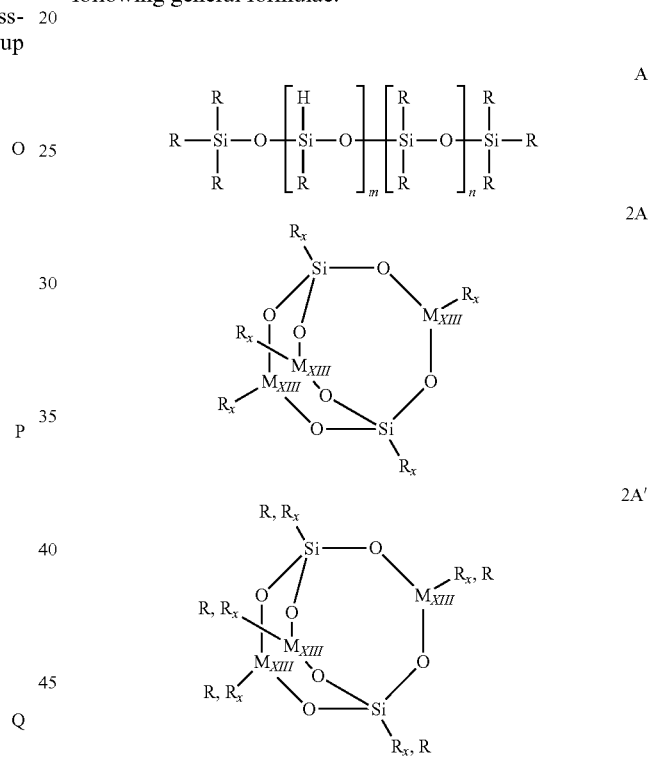

wherein for A, each R independently represents a group selected from hydride, alkyl, alkenyl, aryl, silyl, and condensable group which is either alkoxyl or hydroxyl, and 'm' and 'n' each are an integer 1 or more; and at least one hydride group is included in the molecule A for the hydrosilation to occur with 2A or 2A';

wherein for compound 2A', the notation 'R, Rx' indicates that there is either one R or Rx at the appropriate locations on 2A'; and there must be at least one Rx on 2A', and the remaining 'R, Rx' positions are either R or Rx;

wherein for 2A and 2A', R each independently represents a group selected from hydride, alkyl, alkenyl, aryl, siloxyl; Rx represents an alkenyl or alkynyl group on the molecules; $M_{XIII}$ represent any group 13 element of the periodic table; where the three $M_{XIII}$ positions on 2A and 2A' have the same group 13 element; and wherein there is at least 0.1 wt % of the 13th group element in cross-linked polyorganosiloxane composite.

19. The curable encapsulating cross-linked polyorganosiloxane composite obtained by the method of claim 18.

20. A method of making a curable encapsulating cross-linked polyorganosiloxane composite comprising:

reacting a compound selected from the group consisting of A", B, and C; with a compound selected from the group consisting of A", B, C, D2, E2, F2, H, I, K, L and M, where A", B, C, D2, E2, F2, H, I, K, L and M are:

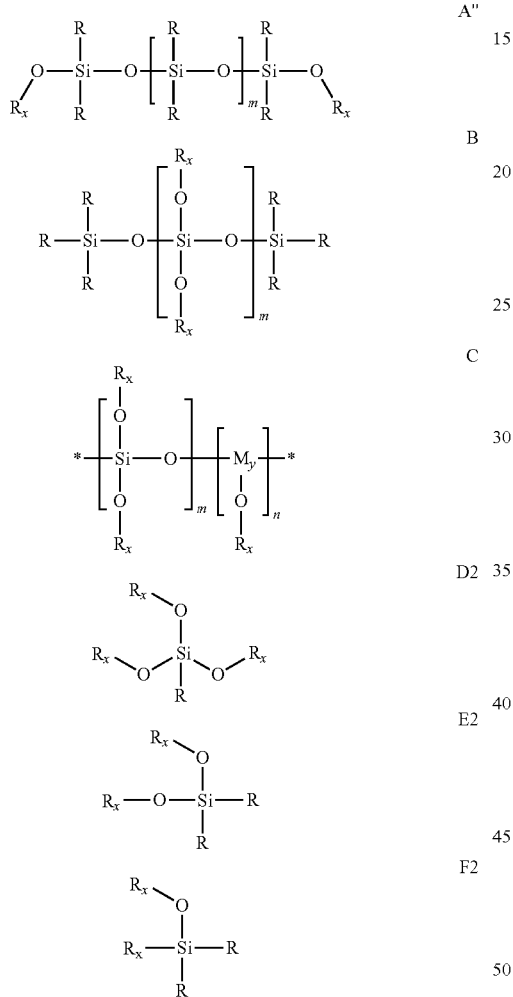

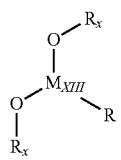

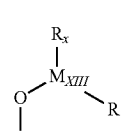

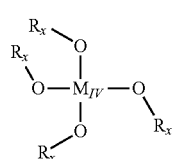

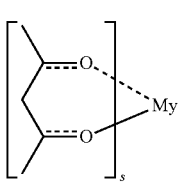

My in structure C, and L represents a group 4 or 13 element of the periodic table and 's' in L is 3 when My is a 13th group element, and 4 when My is a 4th group element; and 'm' and 'n' represents an integer of 1 or more; and where structures A", B, and C are either hydroxyl or alkoxyl containing compounds; wherein each R independently represent a group selected from hydride, alkyl, alkenyl, aryl, and siloxyl groups (at least one R is alkyl, alkenyl, or aryl); O—Rx represents condensable hydroxyl, alkoxyl groups; $M_{XIII}$ in H, I and M represents any group 13 element of the periodic table; $M_{IV}$ in M represents any group 4 element of the periodic table; for M, the two $M_{XIII}$ positions have the same group 13 element; and where there is at least 0.1 wt % of the 4th or 13th group element or a combination of elements in cross-linked polyorganosiloxane composite.

21. The curable encapsulating cross-linked polyorganosiloxane composite obtained by the method of claim 20.

* * * * *